(12) United States Patent
Chung et al.

(10) Patent No.: US 11,694,841 B2
(45) Date of Patent: Jul. 4, 2023

(54) POWER MONITORING AND DISTRIBUTING SYSTEMS

(71) Applicant: VERDIGRIS TECHNOLOGIES, INC., Mountain View, CA (US)

(72) Inventors: Thomas Chung, Mountain View, CA (US); Jon Chu, Mountain View, CA (US); Santo Ko, Mountain View, CA (US); Danny Serven, Mountain View, CA (US); Martin Chang, Mountain View, CA (US); Jared Kruzek, Mountain View, CA (US); Diego Torres, Mountain View, CA (US); Sami Shad, Mountain View, CA (US); Joe Phaneuf, Mountain View, CA (US); Jacques Kvam, Mountain View, CA (US); Anjali Sehrawat, Mountain View, CA (US); Daniela Li, Mountain View, CA (US); Michael Roberts, Mountain View, CA (US); Jason Goldman, Mountain View, CA (US)

(73) Assignee: Verdigris Technologies, Inc., Mountain View, CA (US)

( * ) Notice: Subject to any disclaimer, the term of this patent is extended or adjusted under 35 U.S.C. 154(b) by 466 days.

(21) Appl. No.: 16/635,978

(22) PCT Filed: Aug. 9, 2018

(86) PCT No.: PCT/US2018/046133
§ 371 (c)(1),
(2) Date: Jan. 31, 2020

(87) PCT Pub. No.: WO2019/032912
PCT Pub. Date: Feb. 14, 2019

(65) Prior Publication Data
US 2021/0142941 A1 May 13, 2021

Related U.S. Application Data

(60) Provisional application No. 62/543,310, filed on Aug. 9, 2017, provisional application No. 62/543,329, filed
(Continued)

(51) Int. Cl.
*G01R 15/04* (2006.01)
*G01R 15/20* (2006.01)
(Continued)

(52) U.S. Cl.
CPC .......... *H01F 27/402* (2013.01); *G01N 22/00* (2013.01); *G01R 15/202* (2013.01); *H01F 27/02* (2013.01);
(Continued)

(58) Field of Classification Search
CPC ........ G01R 15/04; G01R 15/20; G01R 19/00; G01R 31/02; G01R 31/36; G01R 33/07; G01V 3/08; G01V 3/10
See application file for complete search history.

(56) References Cited

U.S. PATENT DOCUMENTS 4,709,339 A 11/1987 Fernandes
5,341,083 A 8/1994 Klontz et al.
(Continued)

FOREIGN PATENT DOCUMENTS

CN 2083754 U 8/1991
CN 203275500 U 11/2013
(Continued)

OTHER PUBLICATIONS

International Search Report for related International Application No. PCT/US2018/046133, dated Jan. 8, 2019 (86 pages).
(Continued)

*Primary Examiner* — Neel D Shah
(74) *Attorney, Agent, or Firm* — Procopio, Cory, Hargreaves & Savitch LLP

(57) ABSTRACT

A current transformer having a body having an upper half and a lower half hingedly connected to the upper half, a pair of ferrite cores located within one of the upper half and the lower half of the body, the pair of ferrite cores defining a gap formed between each ferrite core of the pair of ferrite cores, and a sensor located within the gap formed between each ferrite core of the pair of ferrite cores.

13 Claims, 23 Drawing Sheets

Related U.S. Application Data on Aug. 9, 2017, provisional application No. 62/543,303, filed on Aug. 9, 2017, provisional application No. 62/543,325, filed on Aug. 9, 2017.

(51) Int. Cl.

| | | |
|---|---|---|
| *G01R 19/00* | (2006.01) | |
| *G01R 31/36* | (2020.01) | |
| *G01R 33/07* | (2006.01) | |
| *G01V 3/08* | (2006.01) | |
| *G01V 3/10* | (2006.01) | |
| *H01F 27/40* | (2006.01) | |
| *H01F 27/02* | (2006.01) | |
| *H01F 27/24* | (2006.01) | |
| *H01F 38/28* | (2006.01) | |
| *G01N 22/00* | (2006.01) | |
| *G01R 27/26* | (2006.01) | |

(52) U.S. Cl.
CPC ............ *H01F 27/24* (2013.01); *H01F 38/28* (2013.01); *G01R 27/26* (2013.01)

(56) References Cited

U.S. PATENT DOCUMENTS

| | | | | |
|---|---|---|---|---|
| 5,426,360 | A * | 6/1995 | Maraio | ............ G01R 1/22 324/126 |
| 2008/0077336 | A1 | 3/2008 | Fernandes | |
| 2012/0200291 | A1 | 8/2012 | Carpenter et al. | |
| 2016/0011241 | A1 | 1/2016 | Phillips et al. | |

FOREIGN PATENT DOCUMENTS

| | | |
|---|---|---|
| CN | 104391169 A | 3/2015 |
| CN | 104755882 A | 7/2015 |
| CN | 106249021 A | 12/2016 |
| CN | 106370907 A | 2/2017 |
| EP | 0965849 A2 | 12/1999 |
| EP | 1846771 A2 | 10/2007 |
| ES | 1159383 U | 6/2016 |
| JP | H01-152241 U | 10/1989 |
| JP | H02-141866 U | 11/1990 |
| JP | H-05-2475 U | 1/1993 |
| JP | H-06-62375 U | 9/1994 |
| JP | H07-325109 A | 12/1995 |
| JP | 2001-235488 A | 8/2001 |
| JP | 2003-98199 A | 4/2003 |
| JP | 2003-185679 A | 7/2003 |
| JP | 2004-361248 A | 12/2004 |
| JP | 2007-205971 A | 8/2007 |
| JP | 2012-212837 A | 11/2012 |

OTHER PUBLICATIONS

Written Opinion for related International Application No. PCT/US2018/046133, dated Jan. 8, 2019 (11 pages).

International Preliminary Report on Patentability for related International Application No. PCT/US2018/046133, dated Feb. 20, 2019 (10 pages).

China National Intellectual Property Administration, The First Office Action, Application No. CN 2018800499800, dated Feb. 7, 2022, in 12 pages.

China National Intellectual Property Administration, Notification of the First Office Action, Application No. CN 202010152128.5, dated Feb. 10, 2022, in 12 pages.

China National Intellectual Property Administration, Notification of the First Office Action, Application No. CN 202010152118.1, dated Feb. 7, 2022, in 14 pages.

Office Action received in pending China Application No. 201880049980.0, dated Nov. 2, 2022, in 11 pages, with partial English translation.

Office Action received in pending China Application No. 202010152118.1, dated Nov. 2, 2022, in 12 pages, with partial English translation.

Second Office Action received in pending Chinese Application No. 202010152128.5, dated Nov. 24, 2022, in 13 pages, with partial English translation.

Final Office Action received in pending Japanese Application No. 2020-506330, dated Feb. 14, 2023, in 20 pages, with English translation.

* cited by examiner

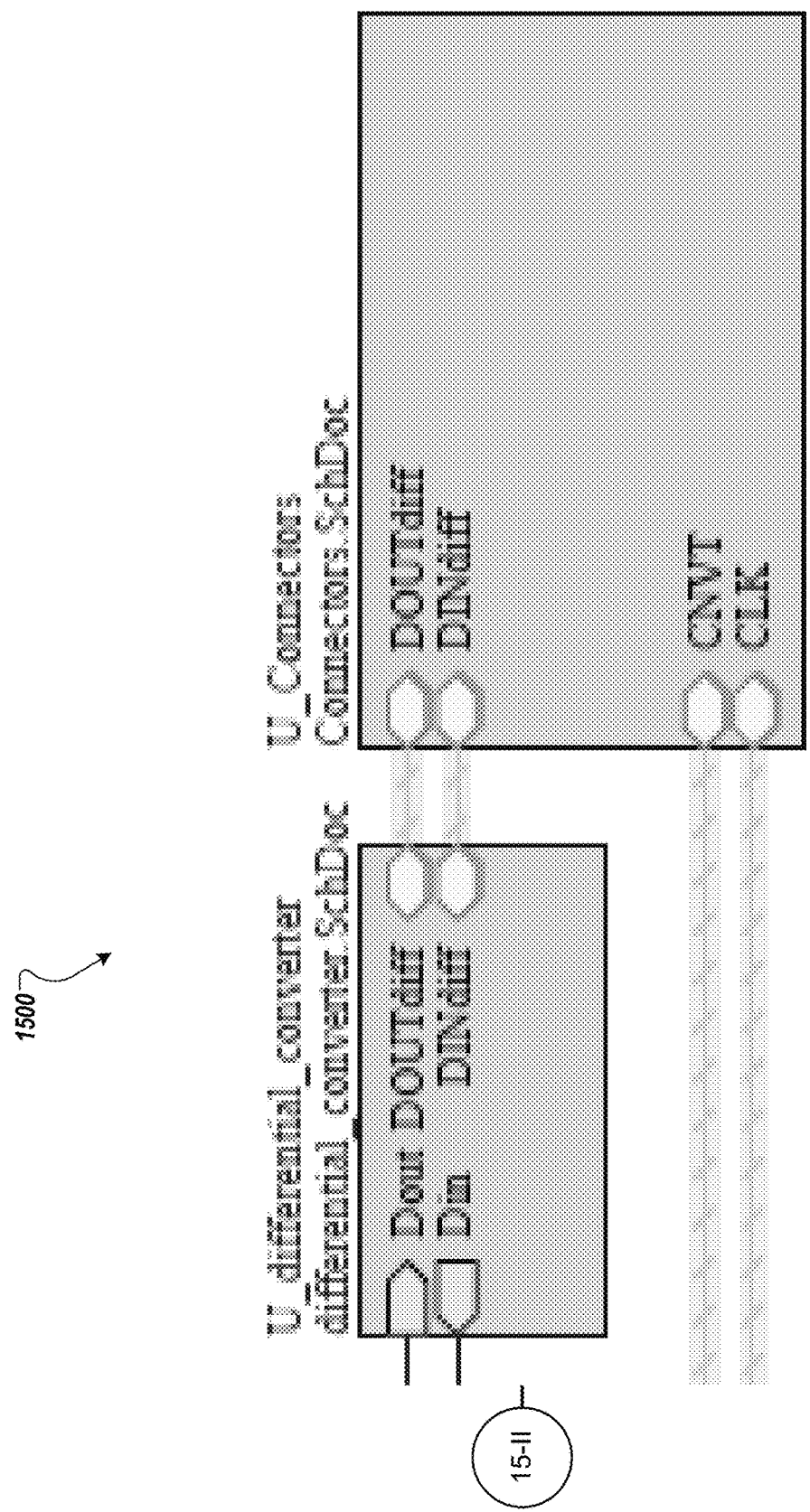
FIG. 15-I

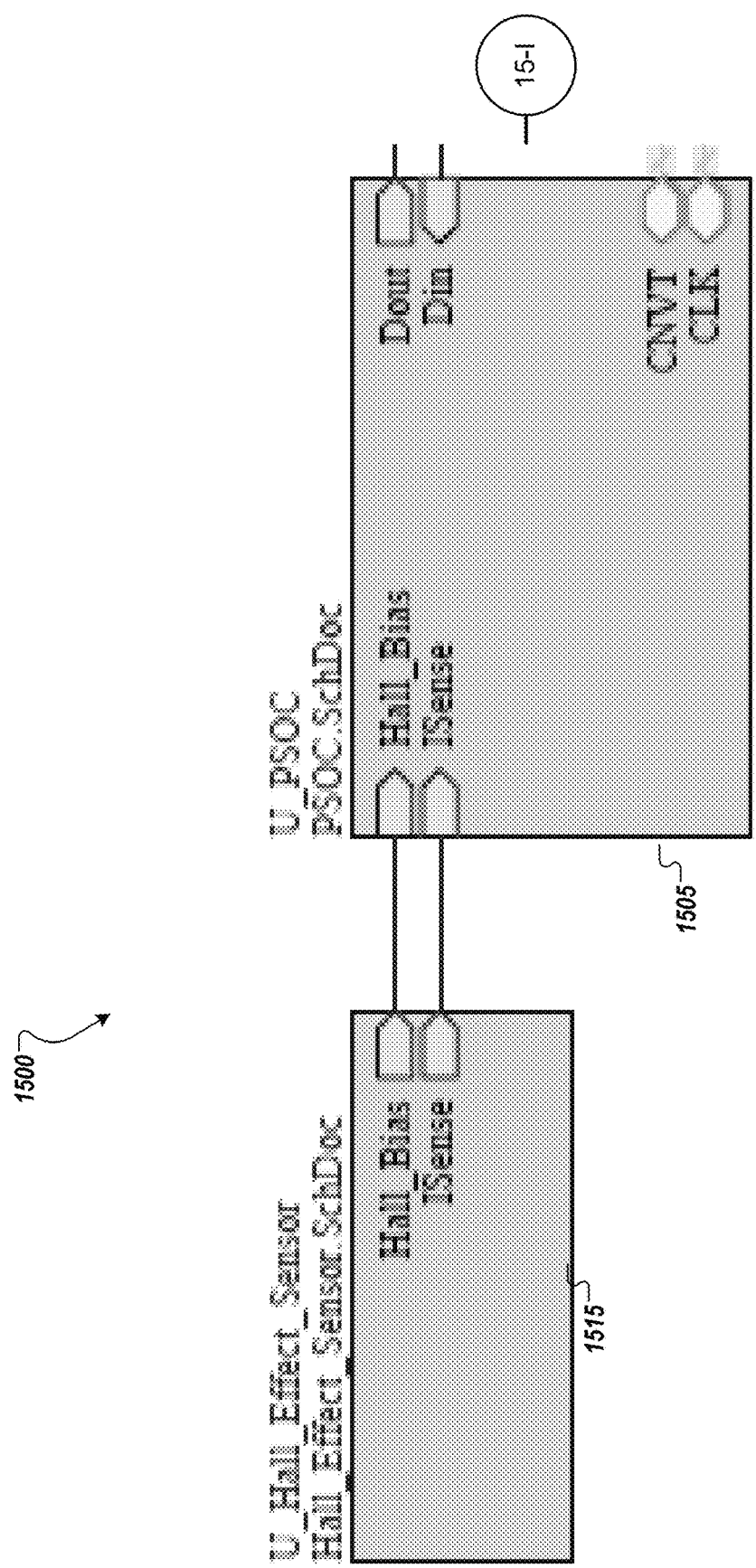
FIG. 15-II

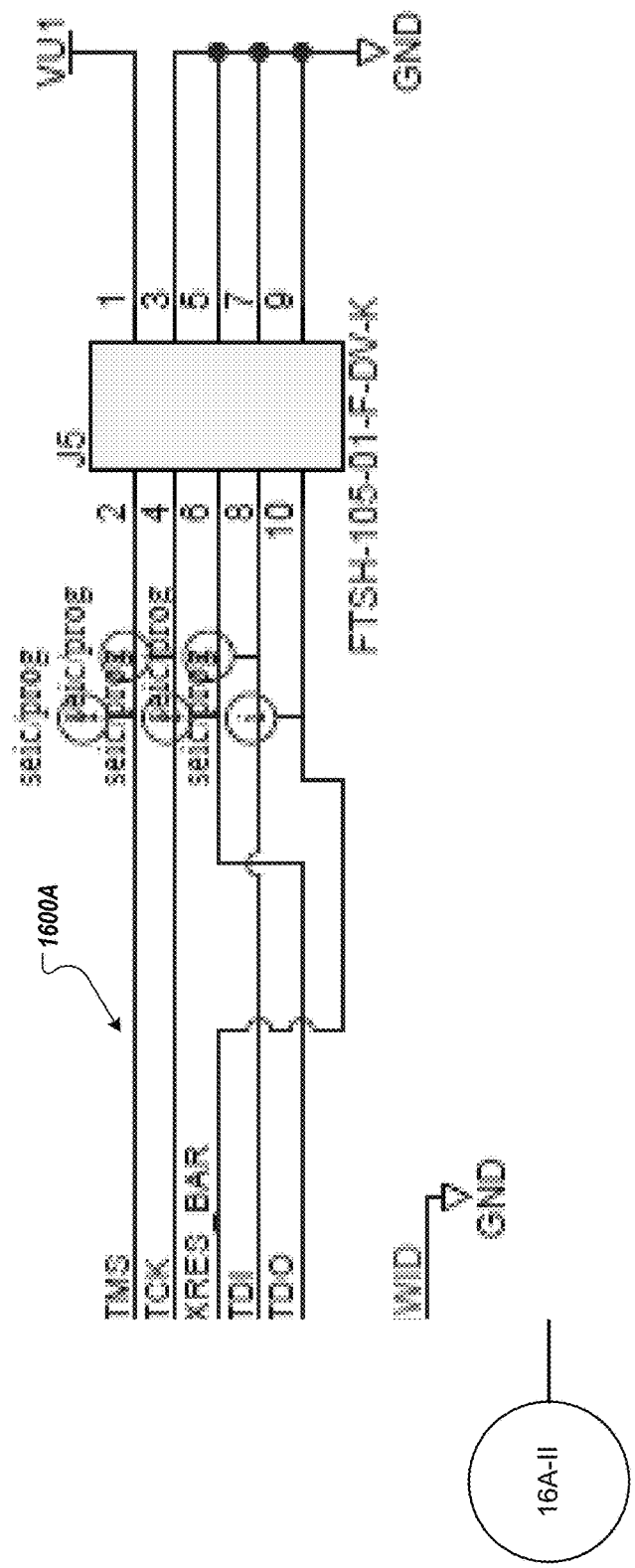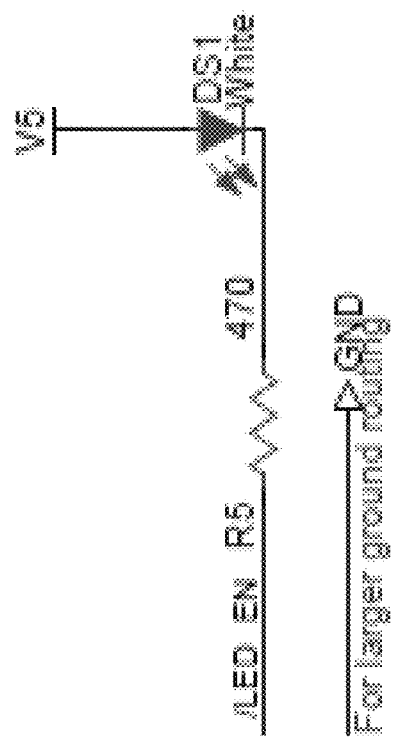
FIG. 16A-I

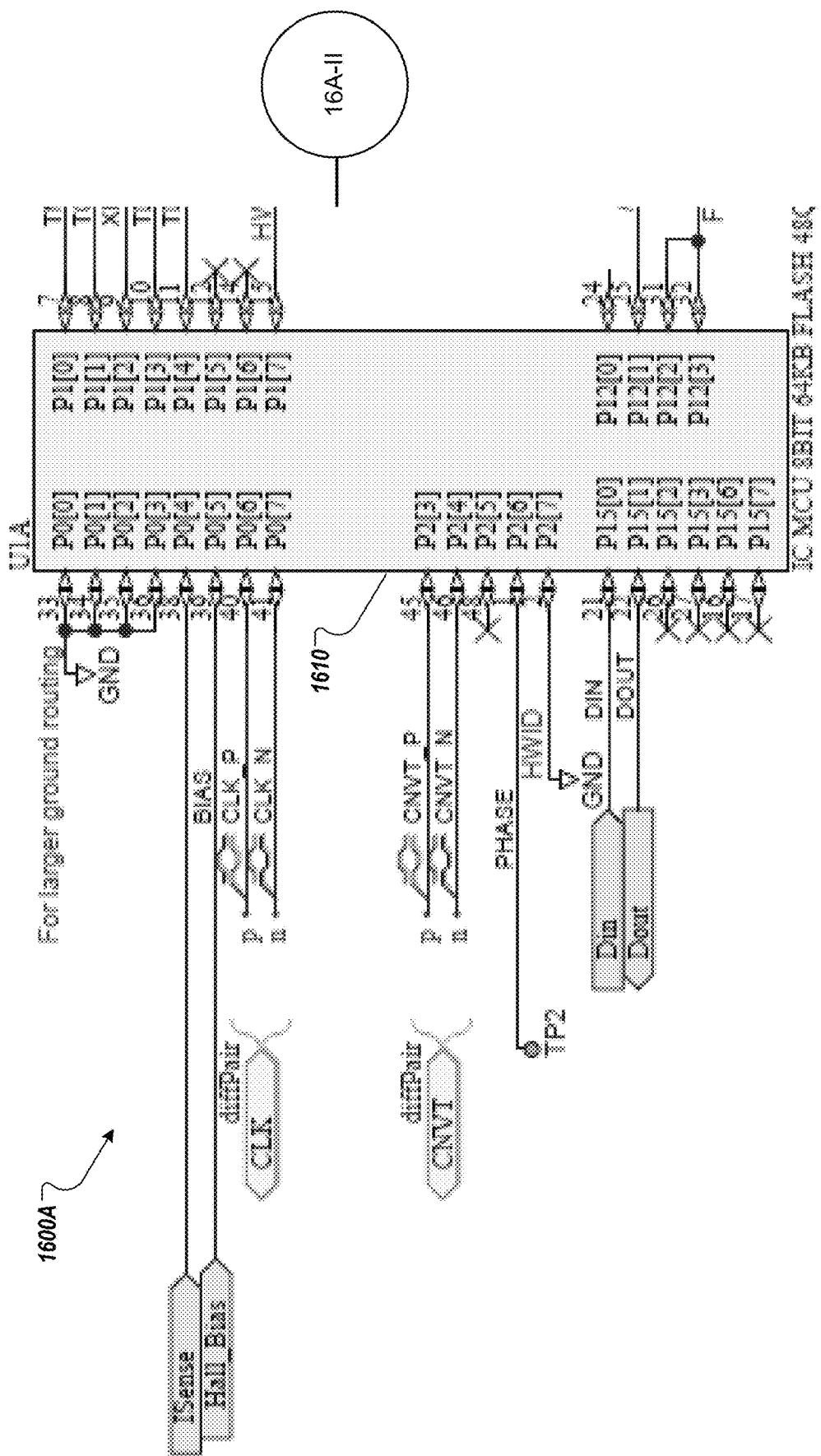
FIG. 16A-II

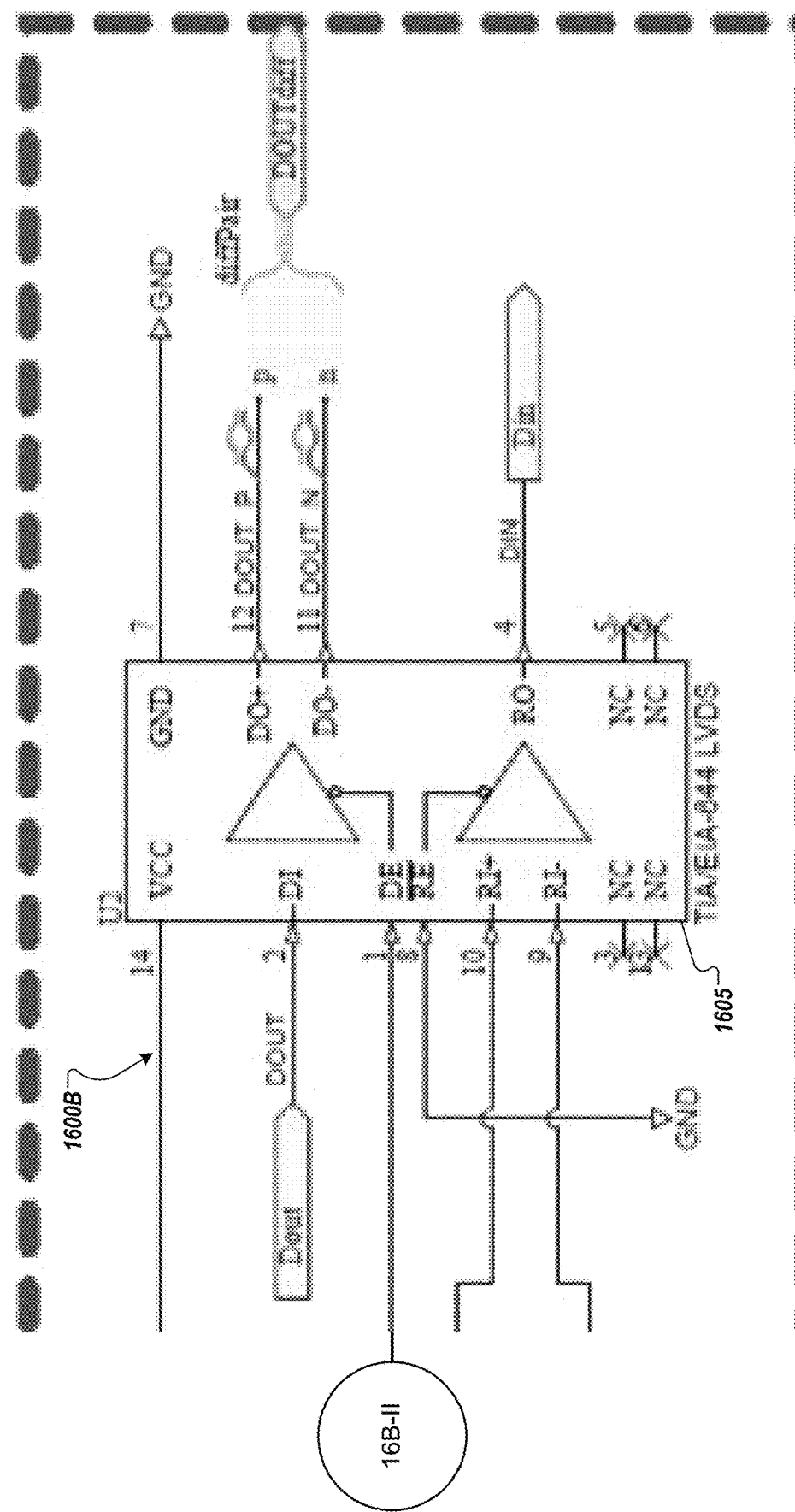
FIG. 16B-I

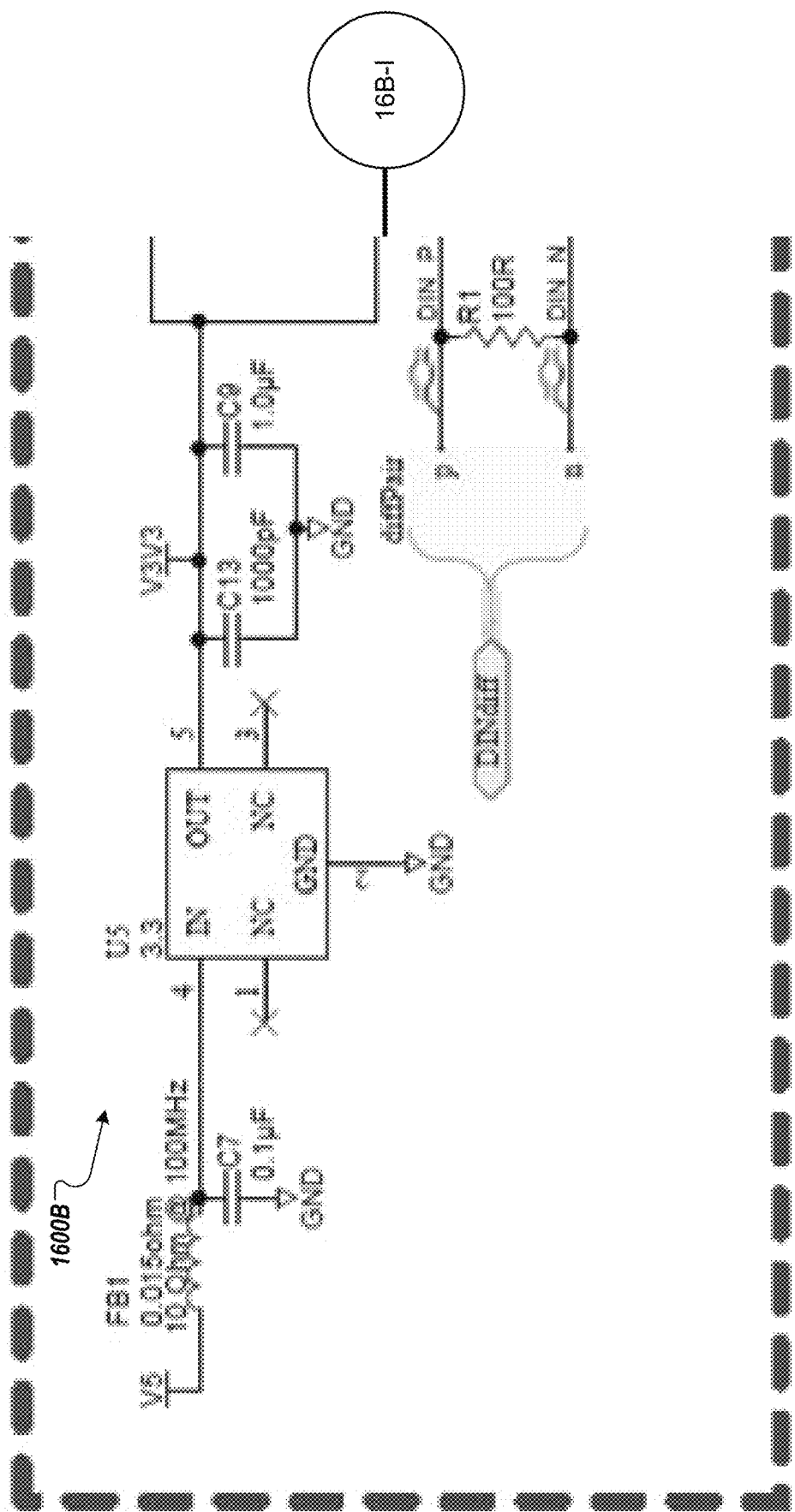
FIG. 16B-II

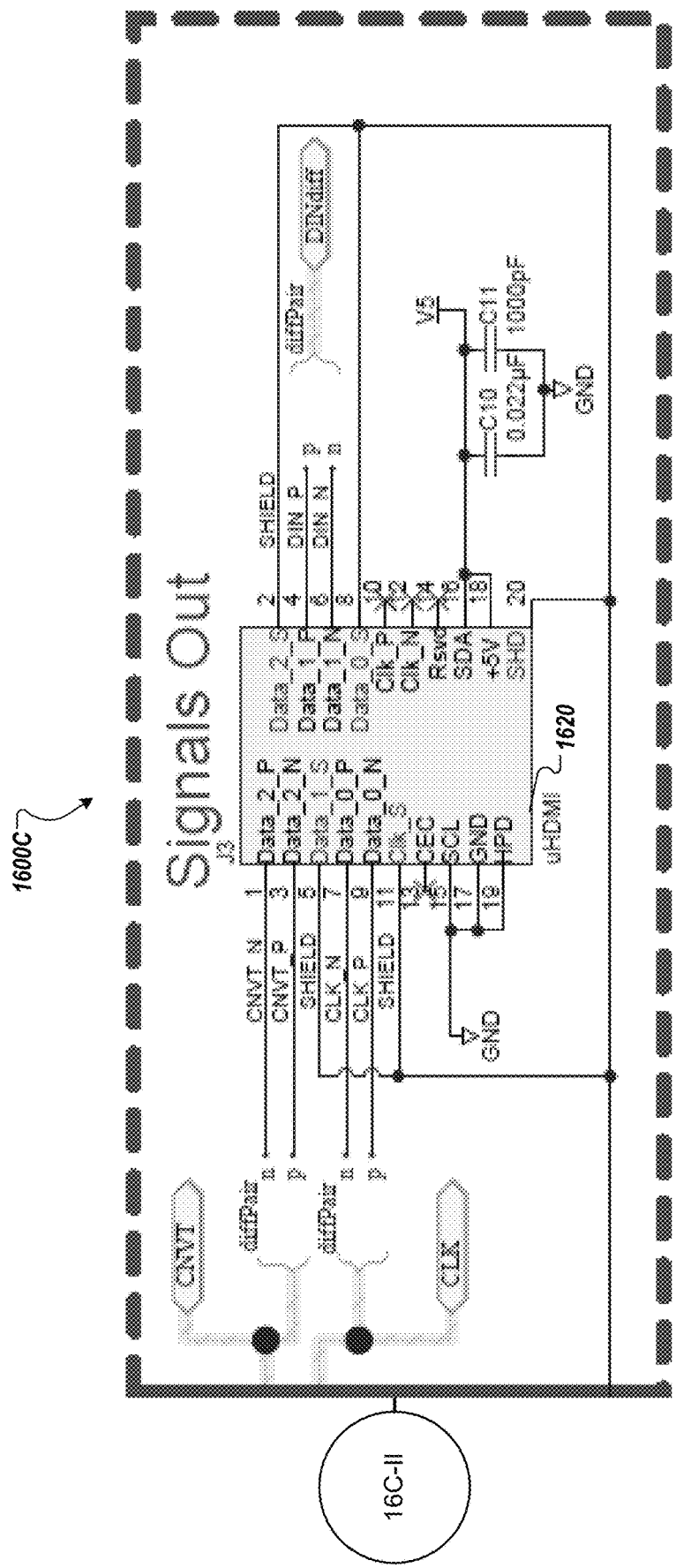
FIG. 16C-I

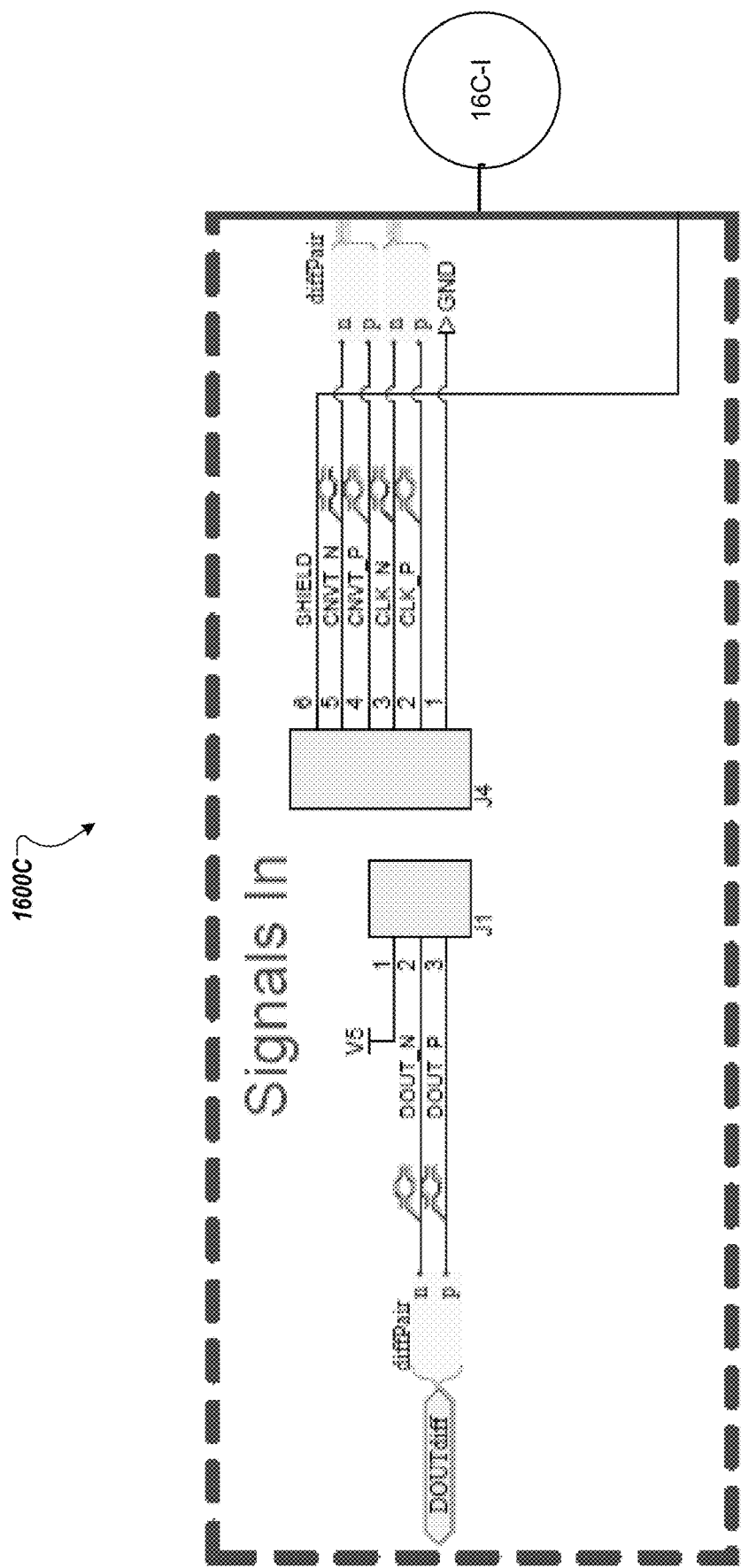
FIG. 16C-II

POWER MONITORING AND DISTRIBUTING SYSTEMS

CROSS-REFERENCE TO RELATED APPLICATIONS

This application is a U.S. National Stage entry of PCT Application No: PCT/US2018/046133 filed Aug. 9, 2018, which claims priority to U.S. Provisional Patent Application Nos. 62/543,310, 62/543,303, 62/543,325, and 62/543,329, filed Aug. 9, 2017, the contents of which are incorporated herein by reference.

BACKGROUND

Field

The present disclosure relates to power systems, and more specifically, to an energy monitoring and distributing systems.

Related Art

In related art implementations, smart meters may record consumption of electrical energy and are rapidly replacing traditional electromechanical meters such as interval or time-of-use meters. Smart meters are attractive to various customer classes (i.e., residential, commercial, and industrial) because they can provide features that traditional electromechanical meters cannot, such as automatic meter reading, real-time or near real-time sensors, power outage notification, remote reporting, and power quality monitoring. In addition, smart meters can communicate information about energy consumption in a two-way wireless communication between the meter and the electric company, thereby facilitating both monitoring and billing. The typical smart meter is limited, however, in that it is designed to calculate only the power consumption (wattage) for an entire structure. Monitoring power consumption in the individual branch circuits of a building is useful to determine the overall energy usage of the building. Individual branch circuit monitoring can also indicate impending fault conditions in the branch circuit and trigger alerts when electrical parameter thresholds are exceeded.

Thus, in related art systems, electric metering may be used to determine how much electricity a consumer is using. In older related art systems, metering was typically accomplished through the use of an electricity meter attached to a power line between a building (home, business, or otherwise) and the electric company. However, such systems often could only provide information about total energy usage for the entire building and could not provide information about energy consumption associated with specific circuits within the building.

Currents in each branch circuit in a building can be measured by connecting a current sensor to sense the current flowing in each of the branch power cables exiting the building's power distribution panel. Related art smart metering systems were developed to analyze individual circuits within a building by connecting a sensor to each circuit, often at the circuit breaker box. However, these related art systems may involve either disconnecting power to the entire box resulting in lost work time or connecting a sensor to the energized power lines, which can be dangerous. Some related art current sensor comprises a sensing transformer that produces an output representative of the electrical current carried by the conductor.

Further, in related art implementations, smart meters generate voltage and power readings that are recorded as waveforms to be streamed to data processing systems. Such waveforms may also carry information regarding events, which can alert the data processing systems of anomalies or other issues with the monitored power system.

Related art sensing transformer may include a coil of wire wrapped around the cross-section of a magnetically permeable core that encircles the power cable. A related art sensing transformer with a hinged, split toroidal core is often used because the transformer can be easily affixed to an installed power cable without disconnecting the power cable. While the related art hinged split core sensing transformer permits encirclement of a connected power cable, the resulting current transfer tends to lose its calibration over time.

Further, related art current transformers are bulky and heavy resulting in difficulty mounting the current transformers at the breaker panel and causing them to pull loose from the wiring to which they are attached. In addition, an excessive number of signal leads can cause interference and crosstalk resulting in poor signal quality.

Further, in related art systems, electric power distribution has been done to fixed, predetermined locations requiring significant pre-arrangement and infrastructure construction. However, related art power distribution systems cannot allow flexibility in selecting where devices are to be connected to the power distribution system.

SUMMARY

Aspects of the present application may include a current transformer. The current transformer may include a body including an upper half and a lower half hingedly connected to the upper half, and a latch mechanism including a grip tab configured to be gripped, a slider mechanism mechanically coupled to the grip tab, a laterally extending tooth mechanically coupled to the slider mechanism, the laterally extending tooth configured to engage an opening to hold the upper half and lower half together in a closed configuration, and a biasing member configured to provide a biasing force to urge the at least one laterally extending tooth the engage the opening, wherein the latch mechanism is configured to translate a tension force applied to the grip portion through the slide mechanism to move the laterally extending tooth relative to the opening formed in the one of the upper half and the lower half such that the opening is disengaged.

Additional aspects of the present application may include a power distribution system. The power distribution system may include a power source, a power distribution line electrically coupled to the power source, a current transformer having a sensing gap configured to mechanically couple to an exterior of the power distribution line, the current transformer configured to extract current from the power distribution line, and an electronic device electrically coupled to the current transformer and configured to be powered by the current extracted from the power distribution line.

BRIEF DESCRIPTION OF THE DRAWINGS

FIG. 15 (broken across two sheets) is a block diagram illustrating current transformer circuitry in accordance with aspects of the present disclosure.

FIGS. 16A-16C (each broken across two sheets) are schematic diagrams illustrating an example control unit and example communications circuitry of the current transformer in accordance with aspects of the present disclosure.

DETAILED DESCRIPTION

Figure 1:
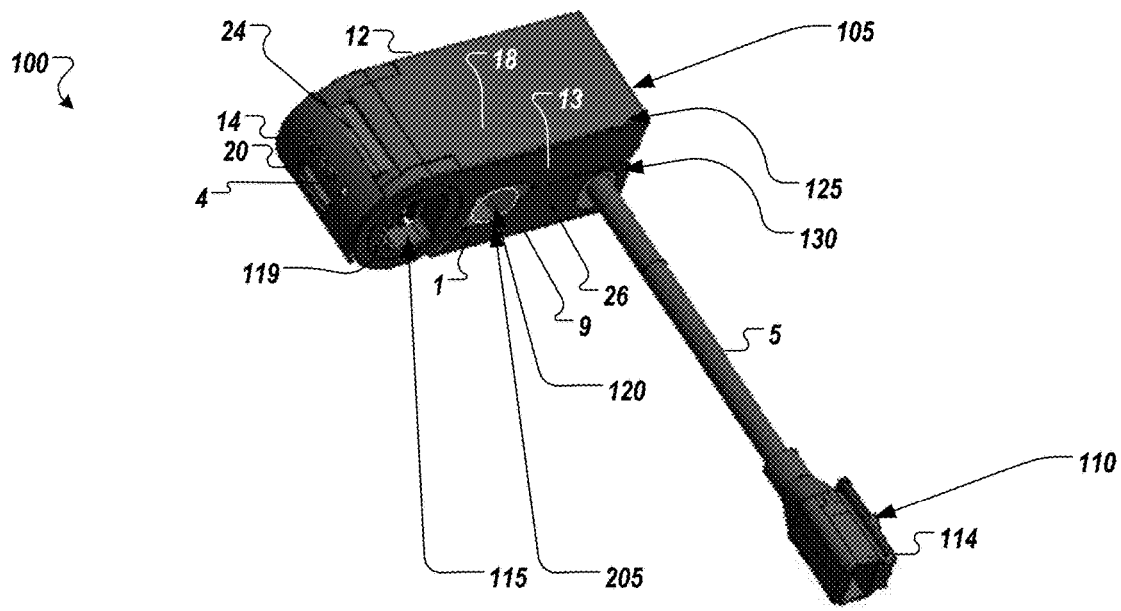
FIG. 1 illustrates a top perspective view of an example current transformer in accordance with aspects of the present disclosure.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or operator control over certain aspects of the implementation, depending on the desired implementation of one of ordinary skill in the art practicing implementations of the present application.

Figure 2:
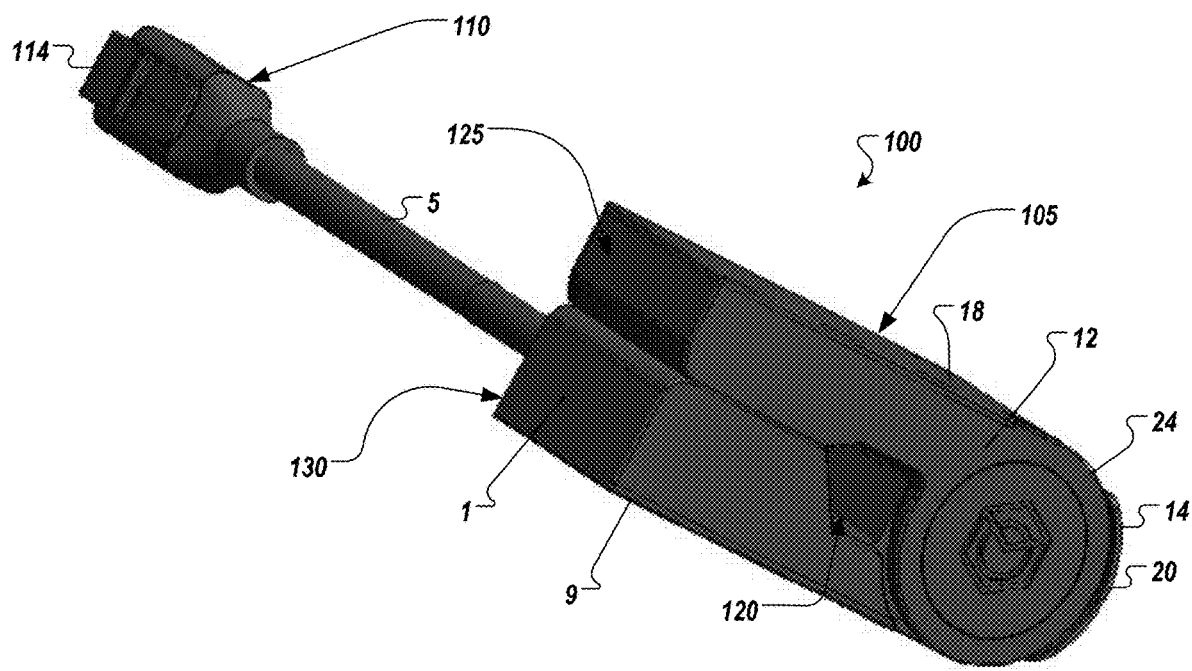
FIG. 2 illustrates a bottom perspective view of an example current transformer in accordance with aspects of the present disclosure.
Figure 3:
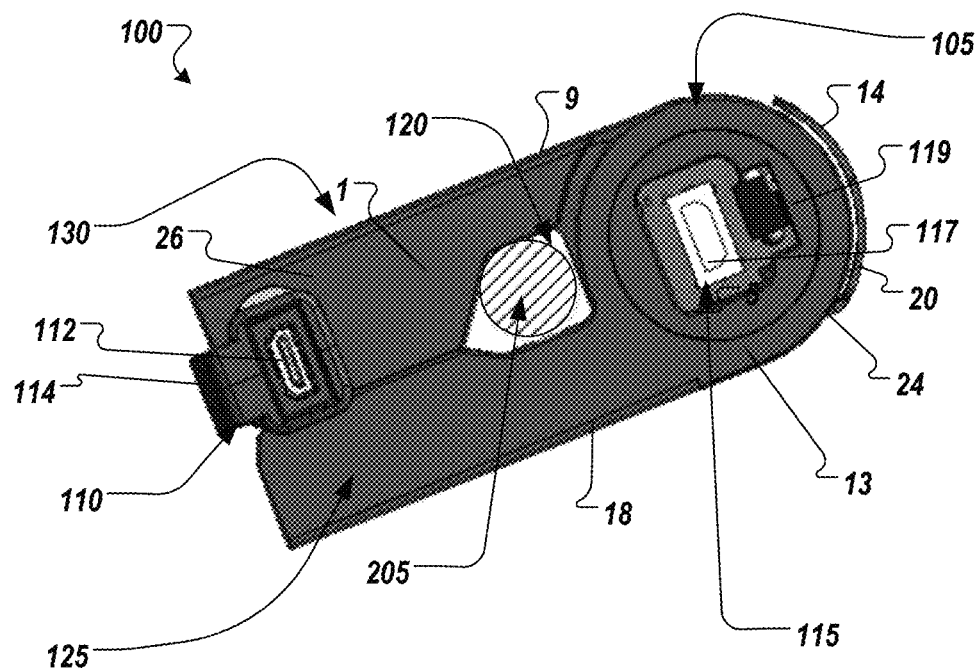
FIG. 3 illustrates a first end perspective view of an example current transformer in accordance with aspects of the present disclosure.
Figure 4:
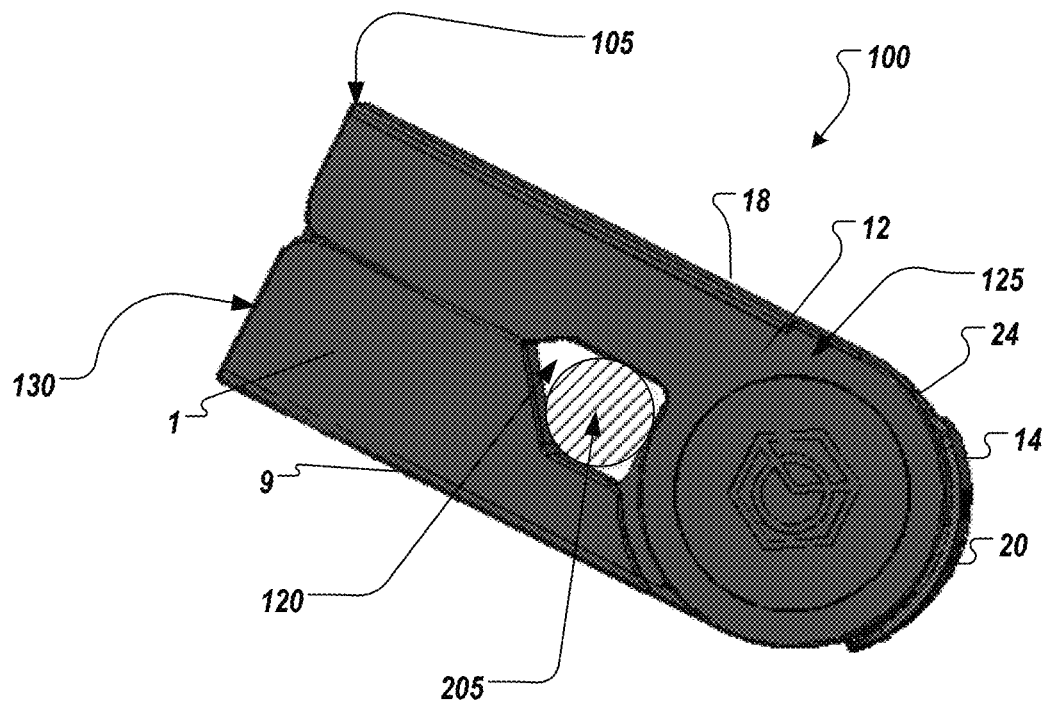
FIG. 4 illustrates a second end perspective view of an example current transformer in accordance with aspects of the present disclosure.
Figure 5:
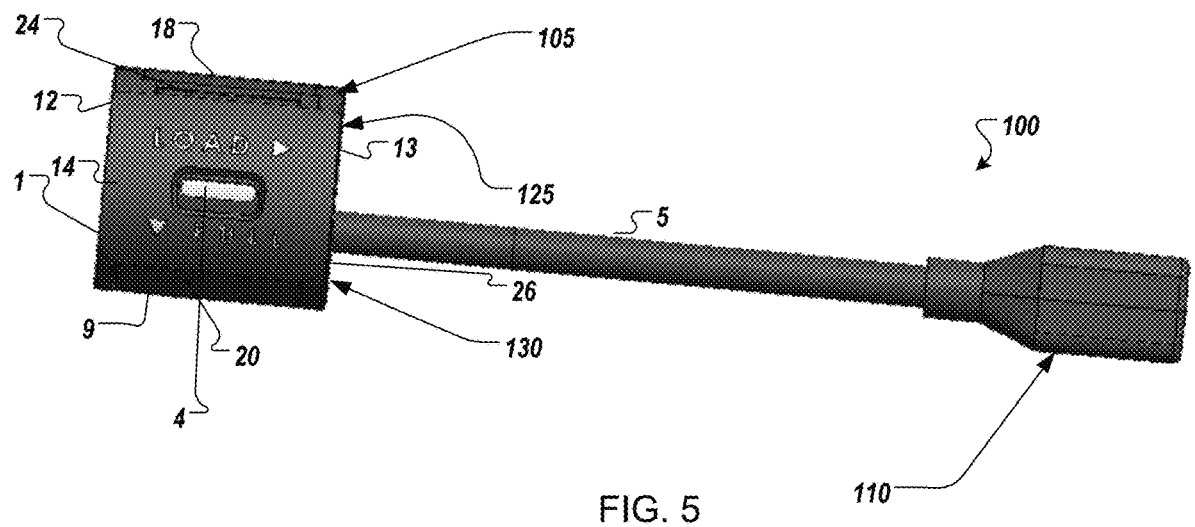
FIG. 5 illustrates a first side perspective view of an example current transformer in accordance with aspects of the present disclosure.
Figure 6:
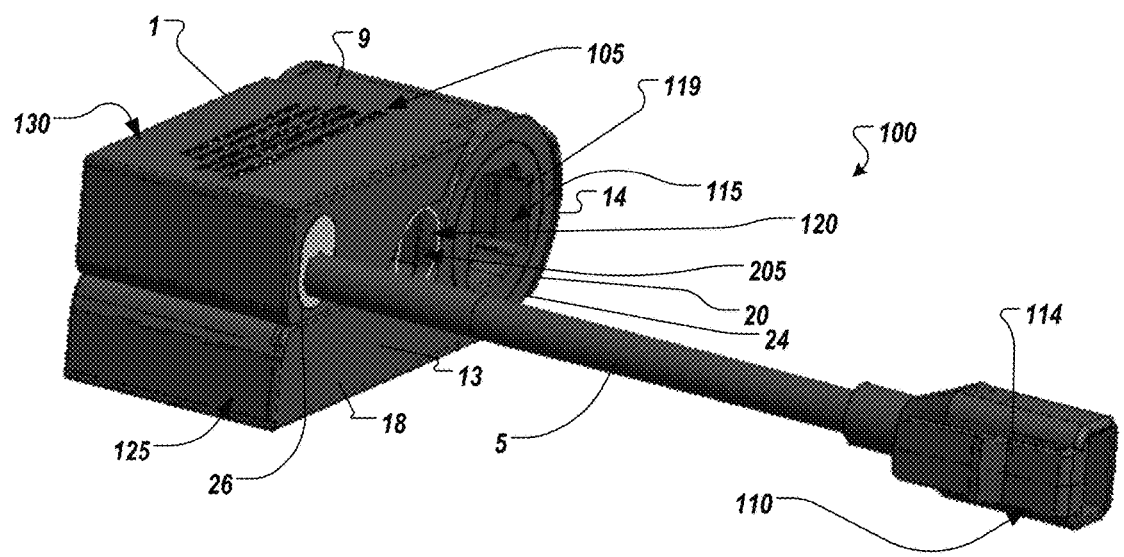
FIG. 6 illustrates a second side perspective view of an example current transformer in accordance with aspects of the present disclosure.

FIGS. 1 and 2 illustrate top and bottom perspective views of an example current transformer 100 in accordance with aspects of the present disclosure. Further, FIGS. 3 and 4 illustrate end perspective views of the example current transformer 100 in accordance with aspects of the present disclosure. FIGS. 5 and 6 illustrate side perspective views of the example current transformer 100 in accordance with aspects of the present disclosure. As illustrated, the current transformer 100 includes a body 105 having a female connector 110 and a male connector 115. In some example embodiments, one or both of the female connector 110 and the male connector 115 may be connected to body 105 by a cable 5. The female and male connectors 110, 115 may be configured to allow connection between multiple current transformers 100 in some example implementations. For example, a female connector 110 of one current transformer 100 may connect to a male connector 115 of another current transformer 100.

In some example implementations, the female connector 110 may include female mini-High Definition Media Interface (mini-HDMI) port 112 and the male connector 115 may include male mini-HDMI plug 117. However, other types of ports and plugs may be apparent to a person of ordinary skill in the art. The female connector 110 may also include a retaining member 114 configured to engage a receiving portion 119 in the male connector 115. In some example implementations, the retaining member 114 may be a flexible member on the female connector 110 configured to engage a corresponding notch on the male connector 115. However, other configurations may be apparent to a person of ordinary skill in the art.

The body 105 may define a sensing gap 120 configured to surround an electrified cable 205. As discussed below, the body 105 may include a variety of sensors and electronics to detect information based on the electrified cable 205 passing through the sensing gap 120. Additionally, the electronics within the body 105 may allow for extraction of current from the electrified cable 205 passing through the sensing gap. The body 105 includes an upper half 125 and a lower half 130 connected by the male connector 115, which may function as a hinge to allow the upper and lower halves 125, 130 to open and close like jaws. As illustrated, the cable 5 connects the female connector 110 to the lower half 130.

The upper half 125 includes a body piece 12 and a body sidewall 13. The upper half 125 also includes a latch mechanism 14 installed on top of the body piece 12 and a lid 18 that connects to the body piece 12 to enclose an interior of the upper half 125. The interior of the upper half 125 is discussed in greater detail below. As discussed below, the latch mechanism 14 includes a grip tab 20 connected to a slider portion 22 (hidden in FIGS. 1-6, illustrated in FIG. 7) by a hinge portion 24. As illustrated, the grip tab 20 may be curved to contour around the male connector 115 in some example implementations. The grip tab 20 may pivot about the hinge portion 24 to allow a tension to be applied to the slider portion 22 to release the latch mechanism 14.

The lower half 130 includes a body portion 1 defining an interior of the lower half 130 and a base plate 9 enclosing the interior of the lower half 130. The interior of the lower half 130 is discussed in greater detail below. The cable 5 may extend through a sidewall 26 of the body portion 1.

The current transformer 100 may also include an indicator element 4, such as an LED or other visual indicator to provide status and/or indicator information such as connection status, signal status or any other information that might be apparent to a person of ordinary skill in the art. As illustrated, the indicator element 4 may be located at one end of the current transformer 100 and be viewable through the grip tab 20.

Figure 7:
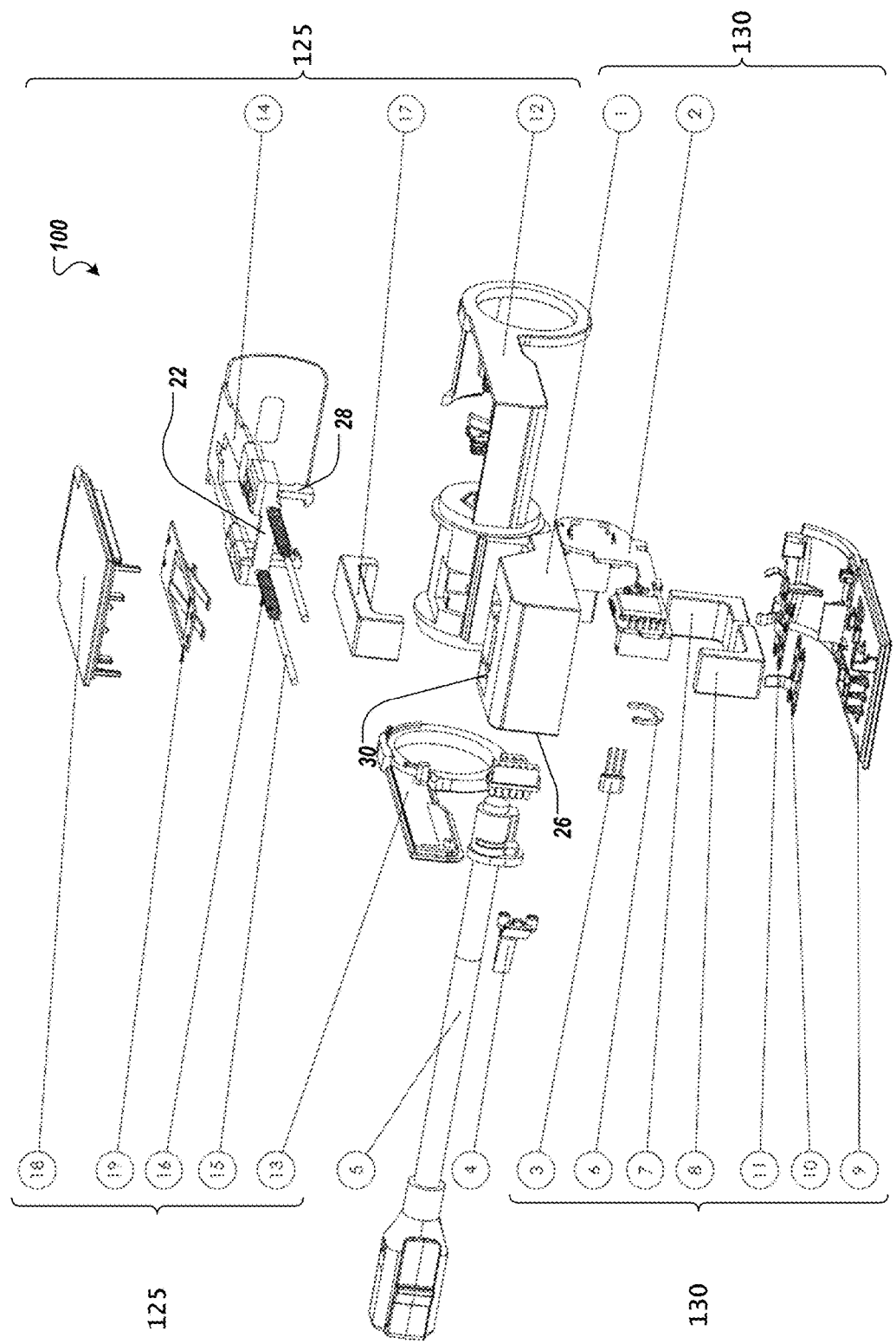
FIG. 7 illustrates an exploded view of an example current transformer in accordance with aspects of the present disclosure.

FIG. 7 illustrates an exploded view of an example current transformer 100 in accordance with aspects of the present disclosure. As discussed above, the upper half 125 includes a body piece 12 and a body sidewall 13. The upper half 125 also includes a latch mechanism 14 installed on top of the body piece 12 and a lid 18 that connects to the body piece 12 to enclose an interior of the upper half 125.

As illustrated in FIG. 7, a unibody upper ferrite core 17 is located within the interior of the upper half 125. The unibody upper ferrite core 17 may have a U-shape configured to contour around the sensing gap 120. Additionally, a ferrite core leaf spring 19 may be located above the unibody upper ferrite core 17 to provide a downward biasing force to urge the unibody upper ferrite core 17 toward the lower half 130.

Additionally, within the interior of the upper half 125, the latch mechanism 14 also includes one or more biasing members 16 (e.g., springs) biasing the slider portion 22 toward the sensing gap 120. The biasing members 16 may be supported by latch pins 15 that may be inserted into the slider portion 22. The slider portion 22 may also include one or more pairs of laterally extending teeth 28 that may be configured to engage teeth receiving openings 30 in the body 1 of the lower half 130. As discussed above, the grip tab 20 of the latch mechanism 14 is connected to the slider portion 22 by a hinge portion 24. As discussed below, when a tensile force is applied to the grip tab 20, the slider portion 22 may move against the biasing force of the biasing members 16 and away from the sensing gap 120 such that the laterally extending teeth 28 disengage the teeth receiving openings 30.

Again, the lower half 130 includes a body portion 1 defining an interior of the lower half 130 and a base plate 9 enclosing the interior of the lower half 130. Within the interior of the lower half 130 a circuit board 2 may be installed with the electronics to control the current transformer 100 and any sensors integrated into the current transformer 100. For example, as illustrated a hall-effect sensor 3 may also be provided within the interior of the lower half 130 and connected to the circuit board 2. Additionally, the indicator element 4 may also be connected to the circuit board 2. The circuit board 2 in combination with the hall-effect sensor 3 may extract current passing through the electrified cable 205 passing through the sensing gap 120.

The interior of the lower half 130 may also include a two-piece lower ferrite core 7, 8. As illustrated below, the two pieces of the lower ferrite core 7, 8 may be located on opposite sides of the hall-effect sensor 3. Each of the pieces of the lower ferrite core 7, 8 may be coupled to a bottom ferrite core leaf spring 11, 10, configured to provide a biasing force urging the pieces of ferrite core 7, 8 toward the upper half 125.

Additionally, within the interior of the lower half 130, a retaining clip 6 may also be provided to retain the cable 5 extending through the sidewall 26 of the body portion 1.

Figure 8:
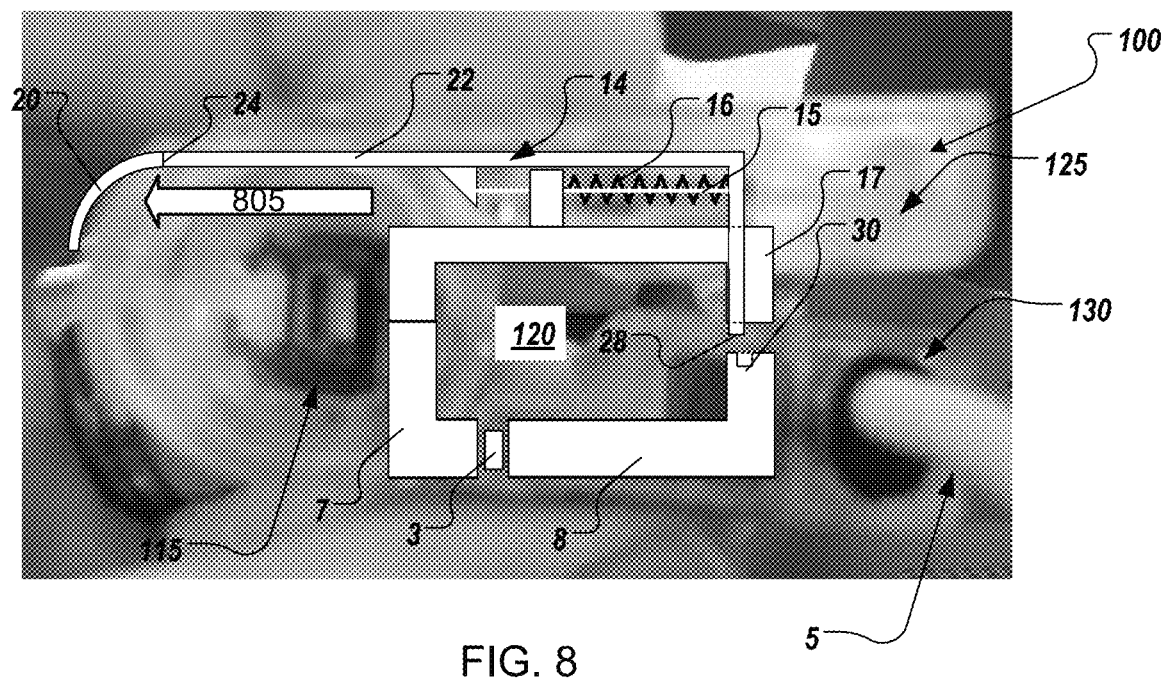
FIG. 8 illustrates a schematic view of an example current transformer in an open configuration in accordance with aspects of the present disclosure.
Figure 9:
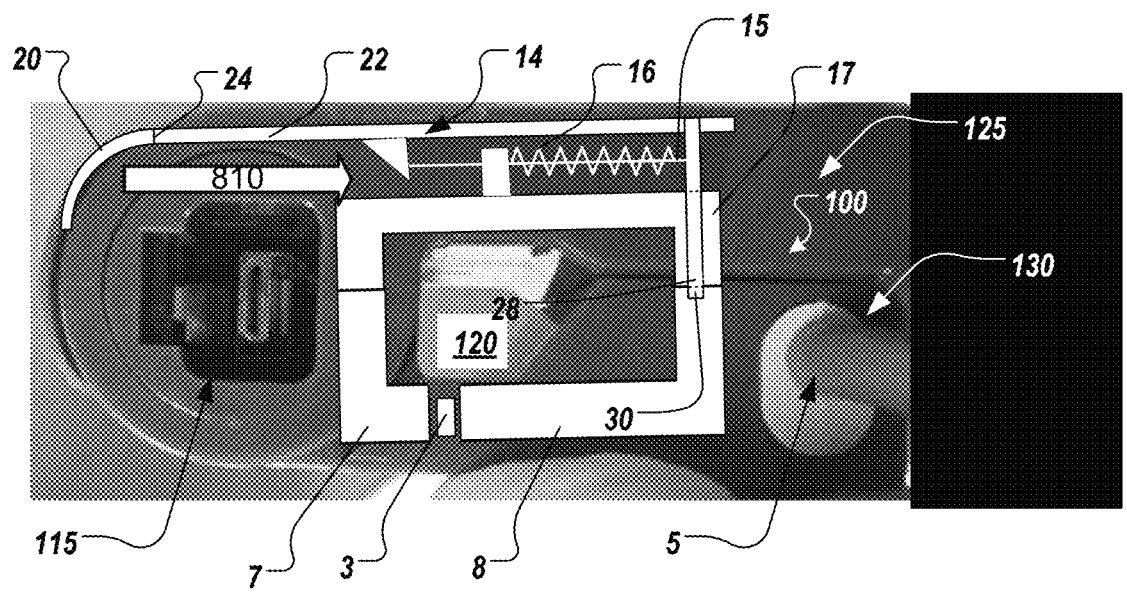
FIG. 9 illustrates a schematic view of an example current transformer in a closed configuration in accordance with aspects of the present disclosure.

FIG. 8 illustrates a schematic view of an example current transformer 100 in an open configuration in accordance with aspects of the present disclosure. Similarly, FIG. 9 illustrates a schematic view of an example current transformer 100 in a closed configuration in accordance with aspects of the present disclosure. For purposes of illustration, the schematic views have been overlaid onto photos of the example current transformer 100.

As illustrated in FIG. 8, the upper and lower halves 125, 130 of the body 105 of the current transformer are in an open configuration by rotating about the male connector 115. By opening in this configuration, an electrified cable 205 (illustrated in FIGS. 1-6) can be inserted into the sensing gap 120. The upper and lower halves 125, 130 may be separated by pulling the grip tab 20 in the direction 805 away from the sensing gap 120. By pulling the grip tab 20 in the direction 805, the slider portion 22 of the latch mechanism 14 may be moved in the direction 805 sliding the latch pins 15 against the biasing force of the biasing members 16. The movement of the slider portion 22 may be translated to the laterally extending teeth 28 causing the laterally extending teeth 28 to move in the direction disengaging the teeth receiving openings 30 of the body 1 of the lower half 130. Once the laterally extending teeth 28 disengage the teeth receiving openings 30, the upper and lower halves 125, 130 may be opened. This structure may allow safe, one handed opening of the upper and lower halves 125, 130 of the body 105 even if gloves are being worn.

As the laterally extending teeth 28 disengage, the laterally extending teeth 28 move relative to the unibody upper ferrite core 17. When upper and lower halves 125, 130 are open, the unibody upper ferrite core 17 is in contact with one lower ferrite core piece 7, but is separated from the other lower ferrite core piece 8. The hall-effect sensor 3 is located below sensing gap 120 between the two lower ferrite core pieces 7, 8. Though a hall-effect sensor 3 is illustrated between the lower ferrite core pieces 7, 8, other types of sensors may be incorporated into the region surrounding the sensing gap 120 to monitor and detect electrical flow through the sensing gap 120 in a non-contacting manner. For example, temperature sensors, flow sensors, or any other sensor may be apparent to a person of ordinary skill in the art. Additionally, the current transformer 100 may extract current from the electrified cable passing through the sensing cap 120. Further, in some example implementations, bladed protrusions may be incorporated into the sensing gap 120 to allow energized cables passing through the sensing gap 120 to be penetrated and directly tapped (e.g., monitored directly or in a contacting manner).

In FIG. 9, the grip tab 20 has been released, allowing the biasing members 16 to bias the slider portion 22 of the latch mechanism 14 in the direction 810. When the slider portion 22 of the latch mechanism 14 is biased in the direction 810, the laterally extending teeth 28 can engage teeth receiving openings 30 to hold the upper and lower halves 125, 130 together securely. This structure may allow safe, one handed closing of the upper and lower halves 125, 130 of the body 105 even if gloves are being worn.

As illustrated in FIG. 9, the upper and lower halves 125, 130 of the body 105 of the current transformer are in the closed configuration. In this configuration, the unibody upper ferrite core 17 contacts both lower ferrite core pieces 7, 8 to form a substantially contiguous magnet circuit around the sensing gap 120 to almost completely enclose any electrified cable 205 (FIGS. 1-6) inserted into the sensing gap 120. However, there is a small gap between the two lower ferrite core pieces 7, 8 into which the hall-effect sensor 3 is installed. By positioning the hall-effect sensor 3 and the lower ferrite core pieces 7, 8 within the body 1 of the lower half 130, spacing of the lower ferrite core pieces 7, 8 and placement of the hall-effect sensor 3 can be constructed and maintained tightly. By maintaining tight control of the spacing of the lower ferrite core pieces 7, 8 and the placement of the hall-effect sensor 3, measurement of current passing through the sensing gap 120 can be obtained. Further, in some example implementations, current may also be extracted from electrified cables 205 (illustrated in FIGS. 1-6) passing through the sensing gap 120.

Again, though a hall-effect sensor 3 is illustrated between the lower ferrite core pieces 7, 8, other types of sensors may be incorporated into the region surrounding the sensing gap 120 to monitor and detect electrical flow through the sensing gap in a non-contacting manner. For example, temperature sensors, flow sensors, or any other sensor may be apparent to a person of ordinary skill in the art. Additionally, the current transformer 100 may extract current from the electrified cable passing through the sensing gap 120. Further, in some example implementations, bladed protrusions may be incorporated into the sensing gap 120 to allow energized cables passing through the sensing gap 120 to be penetrated and directly tapped (e.g., monitored directly or in a contacting manner).

In the example implementations of a current transformer 100 discussed above, only one sensing gap 120 was provided. However, example implementations are not limited to this configuration and may have a plurality of sensing gaps as discussed below.

Figure 10:
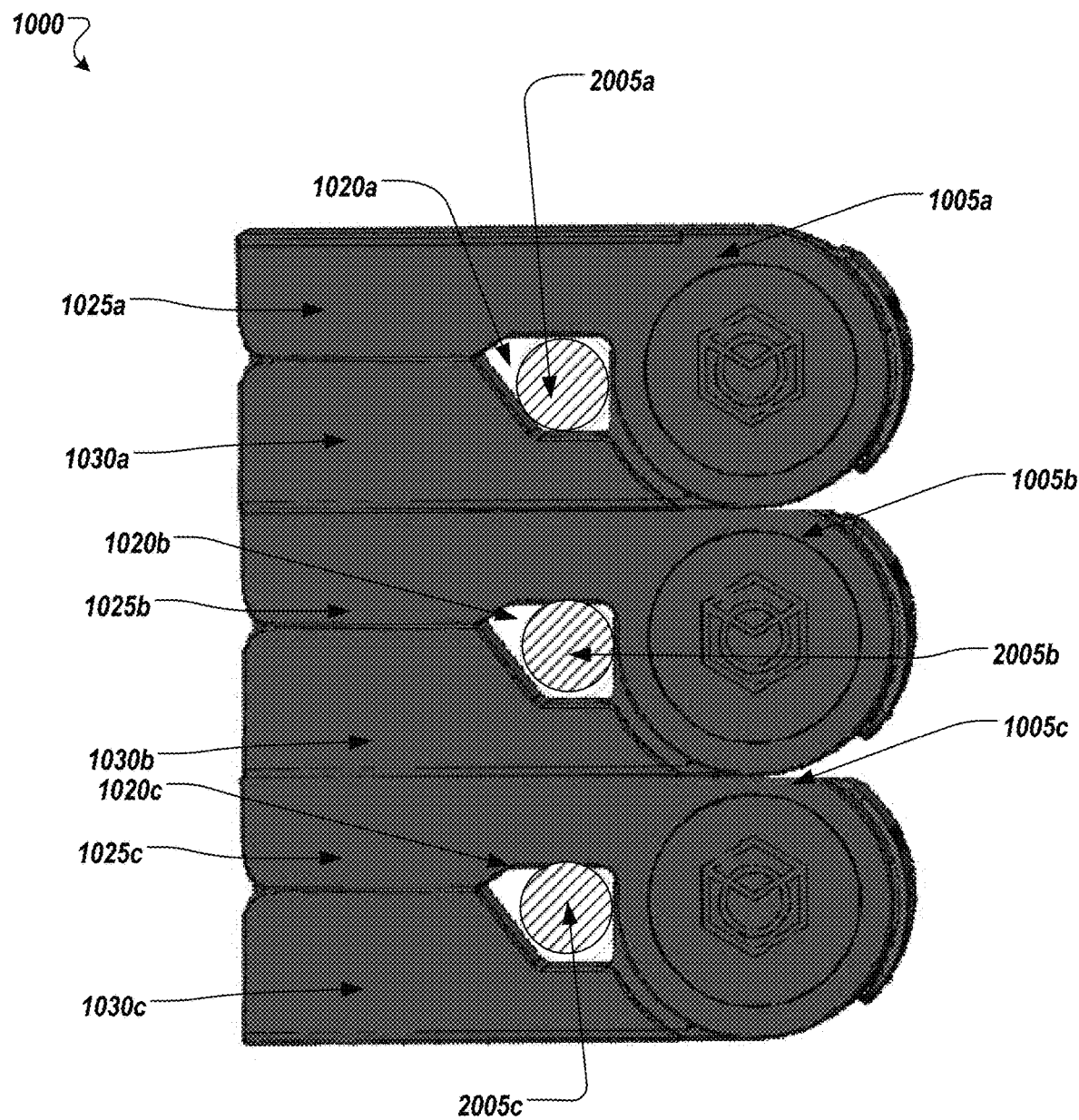
FIGS. 10-12 illustrate example multi-gap current transformers in accordance with aspects of the present disclosure.
Figure 11:
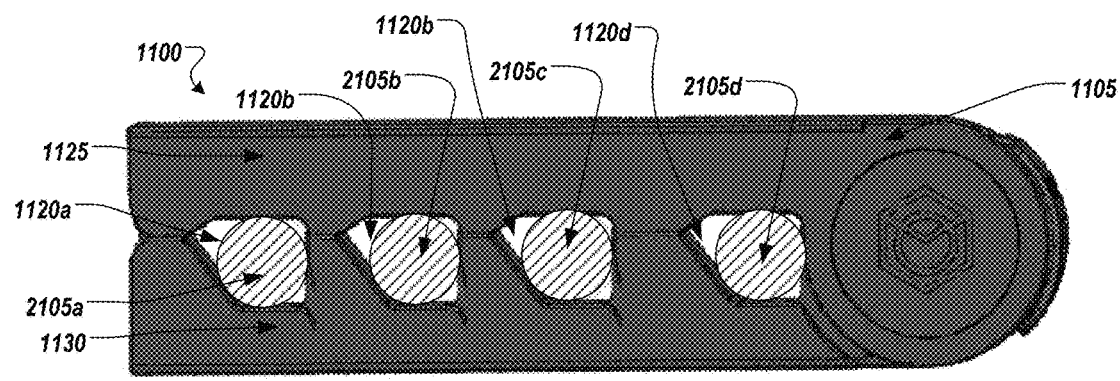
Figure 12:
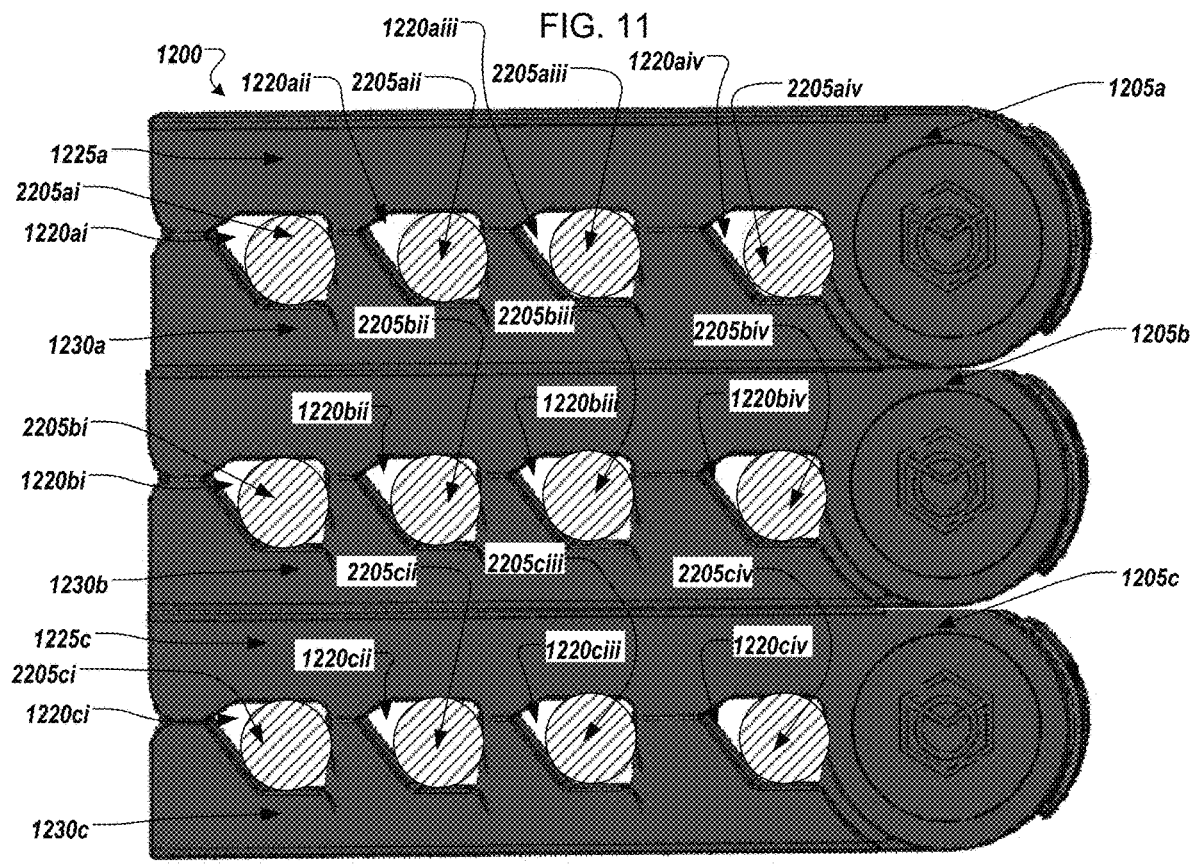

FIGS. 10-12 illustrate example multi-gap current transformers in accordance with aspects of the present disclosure. FIG. 10 illustrates an example implementation of a current transformer 1000 that has a plurality of sensing gaps 1020a, 1020b, 1020c, each arranged in a parallel arrangement to surround electrified cables 2005a, 2005b, 2005c. As illustrated, each sensing gap 1020a, 1020b, 1020c is formed by a separate body 1005a, 1005b, 1005c. Each of the separate bodies 1005a, 1005b, 1005c may have a construction similar to the current transformer 100 illustrated in FIGS. 1-9 above. For example, the upper body 1005a may be formed by an upper half 1025a having a construction similar to the upper half 125 and a lower half 1030a having a construction similar to the lower half 130. Similarly, the middle body 1005b may be formed by an upper half 1025b having a construction similar to the upper half 125 and a lower half 1030b having a construction similar to the lower half 130. Further, the lower body 1005c may be formed by an upper half 1025c having a construction similar to the upper half 125 and a lower half 1030c. Thus, redundant discussion of the components of the upper halves 1025a-1025c and the lower halves 1030a-1030c has been omitted.

As illustrated, the lower half 1030a of the upper body 1005a is mechanically coupled to the upper half 1025b of the middle body 1005b. The mechanical coupling is not particularly limited and may include adhesive attachment, mechanical attachment (e.g., screw attachment, bolt attachment, tongue & groove, etc.), welding, or any other attachment mechanism that might be apparent to a person of ordinary skill in the art. Alternatively, the upper half 1025b of the middle body 1005b may be formed integrally with the lower half 1030a of the upper body 1005a.

Further, the lower half 1030b of the middle body 1005b is mechanically coupled to the upper half 1025c of the lower body 1005c. The mechanical coupling is not particularly limited and may include adhesive attachment, mechanical attachment (e.g., screw attachment, bolt attachment, tongue & groove, etc.), welding, or any other attachment mechanism that might be apparent to a person of ordinary skill in the art. Alternatively, the upper half 1025c of the lower body 1005c may be formed integrally with the lower half 1030b of the middle body 1005c.

Though three sensing gaps are illustrated in FIG. 10, other example implementations may have more or less than three sensing gaps.

The structure of the current transformer 1000 described above may provide a number of benefits. For example, the structure may enable one handed operation, both closing and opening. Most related art structures cannot do this. This feature may be enabled by the spring closed mechanism and relatively small swing of the hinge. Conversely, related art structures use friction for mechanical latching, which requires more force and applicable from one hand or the arm swing is too large to close with one hand.

FIG. 11 illustrates an example implementation of a current transformer 1100 that has a plurality of sensing gaps 1120a, 1120b, 1120c, 1120d, each arranged in a linear arrangement to surround electrified cables 2105a, 2105b, 2105c, 2105d. As illustrated, the plurality of sensing gaps 1120a, 1120b, 1120c, 1120d is formed by single body 1105. The single body 1105 may have a construction similar to the current transformer 100 illustrated in FIGS. 1-9 above. For example, the body 1105 may be formed by an upper half 1125 having a construction similar to the upper half 125 and a lower half 1130 having a construction similar to the lower half 130. Though four sensing gaps 1120a, 1120b, 1120c, 1120d are illustrated in FIG. 11, other example implementations may have more or less than four sensing gaps.

FIG. 12 illustrates an example implementation of a current transformer 1200 that has a plurality of groups of sensing gaps 1220ai-aiv, 1220bi-biv, 1220ci-civ. Each group of sensing gaps 1220ai-aiv, 1220bi-biv, 1220ci-civ is in parallel arrangement with each of the other groups of sensing gaps 1220ai-aiv, 1220bi-biv, 1220ci-civ, as illustrated. Additionally, the sensing gaps 1220ai, 1220aii, 1220aiii, 1220aiv is in linear arrangement to surround electrified cables 2220ai, 2220aii, 2220aiii, 2220aiv. Further, the sensing gaps 1220bi, 1220bii, 1220biii, 1220biv is in linear arrangement to surround electrified cables 2220bi, 2220bii, 2220biii, 2220biv. Still further, the sensing gaps 1220ci, 1220cii, 1220ciii, 1220civ is in linear arrangement to surround electrified cables 2220ci, 2220cii, 2220ciii, 2220civ.

As illustrated, each group of sensing gaps 1220ai-aiv, 1220bi-biv, 1220ci-civ is formed by a separate body 1205a, 1205b, 1205c. Each of the separate bodies 1205a, 1205b, 1205c may have a construction similar to the current transformer 100 illustrated in FIGS. 1-9 above. For example, the upper body 1205a may be formed by an upper half 1225a having a construction similar to the upper half 125 and a lower half 1230a having a construction similar to the lower half 130. Similarly, the middle body 1205b may be formed by an upper half 1225b having a construction similar to the upper half 125 and a lower half 1230b having a construction similar to the lower half 130. Further, the lower body 1205c may be formed by an upper half 1225c having a construction similar to the upper half 125 and a lower half 1030c. Thus, redundant discussion of the components of the upper halves 1225a-1225c and the lower halves 1230a-1230c has been omitted.

As illustrated, the lower half 1230a of the upper body 1205a is mechanically coupled to the upper half 1225b of the middle body 1205b. The mechanical coupling is not particularly limited and may include adhesive attachment, mechanical attachment (e.g., screw attachment, bolt attachment, tongue & groove, etc.), welding, or any other attachment mechanism that might be apparent to a person of ordinary skill in the art. Alternatively, the upper half 1225b of the middle body 1205b may be formed integrally with the lower half 1230a of the upper body 1205a.

Further, the lower half 1230b of the middle body 1205b is mechanically coupled to the upper half 1225c of the lower body 1205c. The mechanical coupling is not particularly limited and may include adhesive attachment, mechanical attachment (e.g., screw attachment, bolt attachment, tongue & groove, etc.), welding, or any other attachment mechanism that might be apparent to a person of ordinary skill in the art. Alternatively, the upper half 1225c of the lower body 1205c may be formed integrally with the lower half 1230b of the middle body 1205c.

Though twelve sensing gaps are illustrated in FIG. 12, other example implementations may have more or less than twelve sensing gaps.

Figure 13:
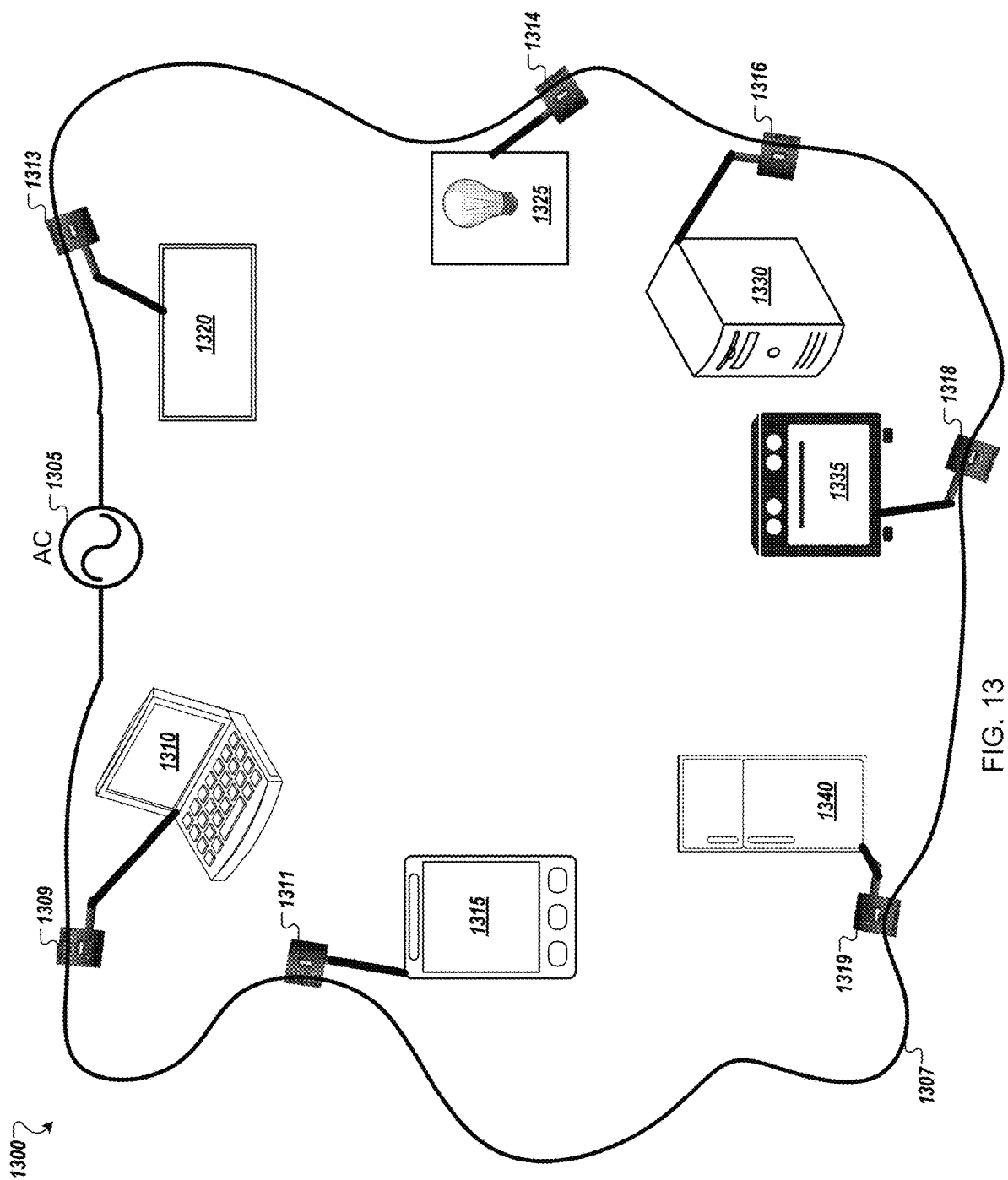
FIG. 13 illustrates a power distribution system using example current transformers in accordance with aspects of the present disclosure.

The current transformers 100, 1000, 1100, 1200 discussed above may be used for a variety of purposes. One possible use in accordance with some example implementations may be as part of a power distribution system. FIG. 13 illustrates such a power distribution system 1300 using example current transformers in accordance with aspects of the present disclosure. As illustrated, the power distribution system 1300 includes an alternating current (AC) power source 1305 (e.g., an AC generator, or other AC source that might be apparent to a person of ordinary skill in the art connected to power distribution line 1307 (e.g., a power cable through which the AC current may be transmitted).

In the power distribution system 1300, a series of current transformers 1309, 1311, 1313, 1314, 1316, 1318, 1319 may be attached to the power distribution line 1307 at any point along its length to allow current extracted at any location along the length of the power distribution line 1307. Each current transformer 1309, 1311, 1313, 1314, 1316, 1318, 1319 may have a structure as the current transformers 100/1000/1100/1200 discussed above with respect to FIGS. 1-12 above. As discussed above with respect to FIGS. 8 and 9, each current transformer 1309, 1311, 1313, 1314, 1316, 1318, 1319 may be opened by pulling a corresponding grip tab of a latch mechanism to release laterally extending teeth to disengage teeth receiving openings and separate upper and lower halves. Once opened, each current transformer 1309, 1311, 1313, 1314, 1316, 1318, 1319 may be attached to the power distribution line 1307 by inserting the power distribution line 1307 into a sensing gap and closing the upper and lower halves.

Each current transformer 1309, 1311, 1313, 1314, 1316, 1318, 1319 may extract current from the power distribution line and provide it to a device 1310, 1315, 1320, 1325, 1330, 1335, 1340 connected to one of the current transformers 1309, 1311, 1313, 1314, 1316, 1318, 1319. For example, current transformer 1309 may be connected to a personal computer device 1310 such as a laptop or desktop computer to provide energy thereto. Further, current transformer 1311 may be connected to a portable electronic device 1315 such as a personal music player, cellular phone, personal digital assistant (PDA), tablet or digital camera to provide energy thereto. Additionally, current transformer 1313 may be connected to a personal entertainment device 1320 such as a television, stereo system, DVD player, Blu-ray player, etc. to provide energy thereto.

Further, the current transformer 1314 may be connected to provide energy to a light source 1325, such as a light bulb, light emitting diode (LED), compact florescent lamp (CFL), or other light producing device that might be apparent to a person of ordinary skill in the art. Additionally, the current transformer 1316 may be connected to provide energy to a server device 1330, mainframe or other networked computing device.

Further, current transformers 1318, 1319 may be connected to provide electricity to home appliances 1335, 1340 such as stoves, ovens, microwaves, refrigerators, etc. Additional current transformers may also be used to extract current from the power distribution line 1307 and provide energy to any device that might be apparent to a person of ordinary skill in the art.

In other implementations, the current transformers discussed above may be used to detect voltage and current waveforms that may be used to identify electrical devices connected to electrical circuits. The electrical circuits may be branch circuits of a building power system. By disaggregating component waveforms of an aggregate signal on an electrical circuit, electrical signatures of device connected to the electrical circuit may be developed. In accordance with aspects of the present disclosure, a current transformer as described above may be used to sense the current waveform on the electrical circuit.

Figure 14:
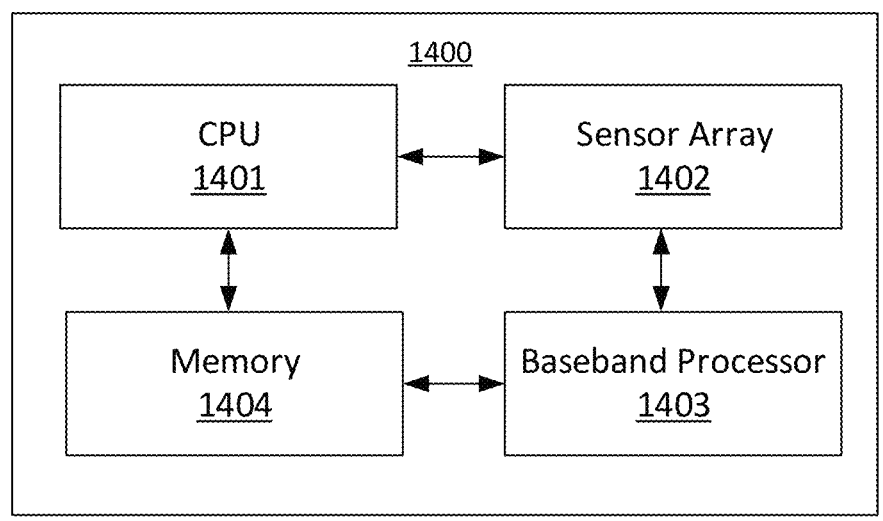
FIG. 14 illustrates an energy monitor in accordance with aspects of the present disclosure.

FIG. 14 illustrates an energy monitor in accordance with aspects of the present disclosure. The energy monitor 1400 may include a CPU 1401, memory 1404, sensor array 1402 and baseband processor 1403. Data from the sensor array 1402 is streamed to the memory 1404 and processed by the CPU 1401 to be prepared in a format for use by a receiving apparatus such as a power monitoring system. Processed data is then transmitted to the receiving apparatus by the baseband processor 1403, which can be implemented as streaming data or batch data over a wireless protocol such as LTE. The data recorded from the sensor array 1402 can include frequency, voltage, and power data, reported at a fixed sample rate, such as 60 Hertz (Hz). In some implementations, current data may alternatively be reported and power data calculated based on the received voltage and current data. The data may be historical, streaming, or both.

In example implementations, a signal may be injected into a sensor (such as a current transformer 100/1000/1100/12000) in the sensor array and the impedance of a burden resistor in the sensor is measured on the energy monitor. Based on the measured impedance, the values can be stored in a table to detect which sensor is connected. Such implementations can make it easier to determine the type of sensor that is installed, thereby eliminating the need for physical inspection as to the type of sensor (e.g., a Current Transformer for 200 amp, for 1000 amp, etc.).

FIG. 15 (broken across two sheets) is a block diagram illustrating current transformer circuitry 1500 in accordance with aspects of the present disclosure. Further, FIGS. 16A-16C (each broken across two sheets) are schematic diagrams 1600A-1600C illustrating an example control unit and example communications circuitry of the current transformer in accordance with aspects of the present disclosure.

Referring to FIGS. 15 and 16A-16C, the electronics package may include a control unit 1505, for example, but not limited to a programmable system on chip (PSoC) or other microprocessor, microcontroller, or programmable device, communications circuits 1605, for example, but not limited to, low voltage differential signaling (LVDS) or other serial/parallel communications circuitry, memory 1610, amplifiers, a Hall effect sensor 1515, and a digital bus 1620. One of ordinary skill in the art will appreciate that other circuit components may be included in the electronics package without departing from the scope of the present disclosure.

The control unit 1505 may include one or more analog-to-digital converters (ADCs), for example but not limited to a 16-bit or other resolution ADCs, one or more digital-to-analog converters (DACs), for example but not limited to a 16-bit or other resolution DACs, volatile and/or non-volatile memory, digital logic circuits, and analog circuitry. The control unit 1505 may control the overall operation of the CT including, but not limited to, communications and data sampling.

Referring to FIG. 16B, single-ended signaling is provided to the adapters and fed into the differential driver, which provides impedance control and low voltage differential signaling (LVDS). Each output signal involves two wires. Thus, every signal coming out involves two wires. The CT may further include a connector to enable connections between the digital bus of the CT and a main control system as well as serial connections with digital buses of a plurality of other CTs in a "daisy-chain" fashion.

In example implementations, multiple sensors (e.g., CTs) can be daisy chained together directly or through adapters, which can involve inputs on the side and/or inputs on the front of the sensors, so that wires from the one sensor can be plugged into terminal blocks of a subsequent sensor, providing channels of data to the energy monitor. Through such connections, the energy monitor can reroute analog systems in the microcontroller, such that the size of the other energy monitors can be automatically detected. In example implementations, when a user installs sensors (e.g., Current transformers (CTs)), a variety of sensors, e.g., 200 amp rated CTs and 1000 amp rated CTs, may be connected to branch circuits of a building power system and daisy-chained together. Based on information transmitted from the sensor, the user can later identify which sensor is connected to which branch circuit as well as the ampere rating of the sensor.

Figure 17A:
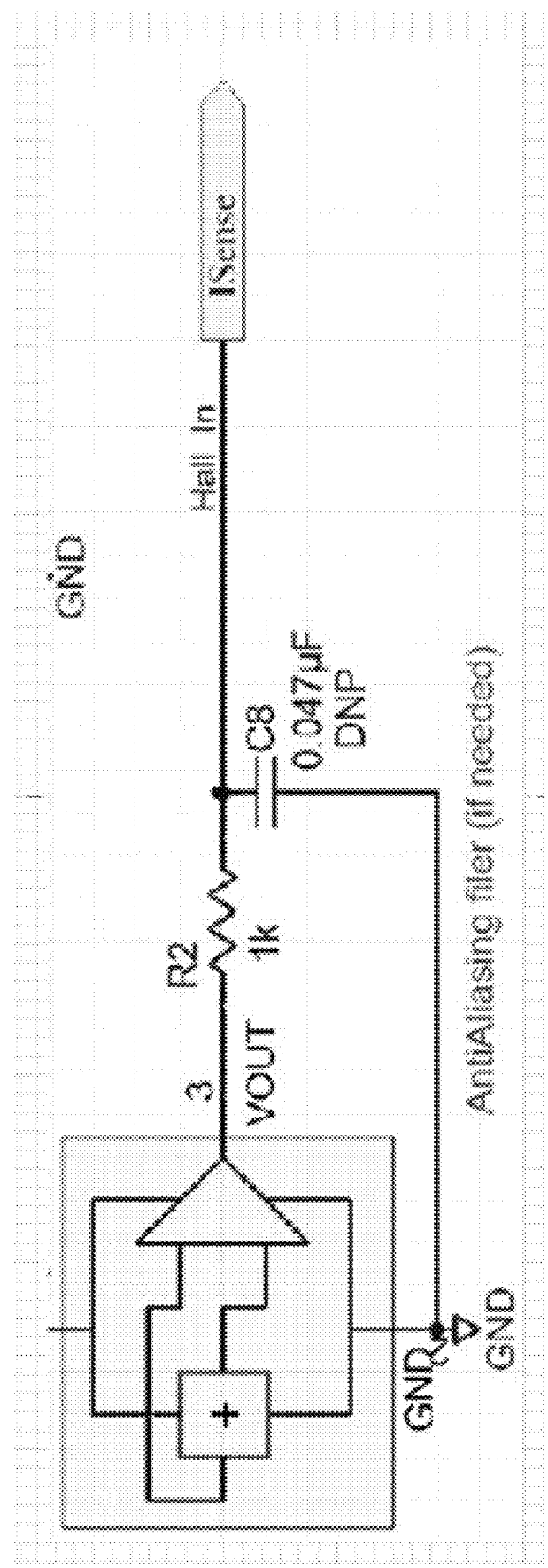
FIGS. 17A and 17B are schematic diagrams illustrating an example Hall effect sensor and associated circuitry in accordance with aspects of the present disclosure.
Figure 17B:
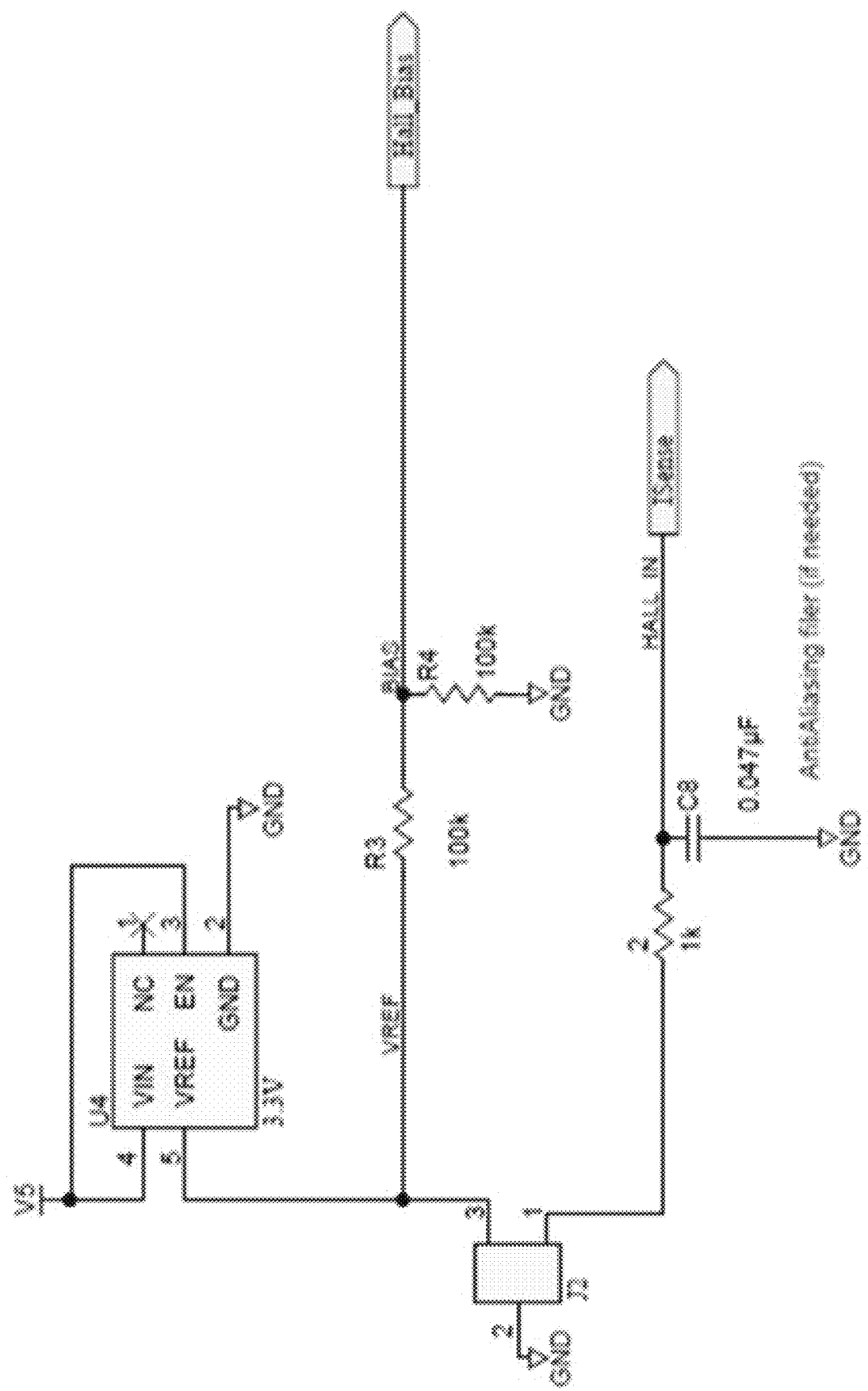

FIGS. 17A and 17B are schematic diagrams illustrating an example Hall effect sensor and associated circuitry in accordance with aspects of the present disclosure. As discussed above, the Hall Effect sensor may be positioned in a gap between the upper and lower ferrite cores to measure flux in the cores. The analog signal from the Hall Effect sensor may be converted to a digital signal enabling the flux measurements to be converted to current measurements by the control unit. In the example of FIG. 17B, single-ended signaling is provided to the adapters and fed into the differential driver, which provides impedance control and low voltage differential. Every signal coming out involves two wires.

The CT may include physical electrical connection to at least one of the ferrite cores of the multi-piece ferrite core to sense a small voltage capacitively coupled to the core resulting from the proximity of the current carrying conductor to the surface area of the at least one of the ferrite cores. For example, a pad on the printed circuit board (PCB) of the electronics package may attach to a spring, and the spring touches at least one of the ferrite cores to provide an electrical connection to the ferrite core. When the ferrite core is aligned, a capacitive coupling to the wire is formed since the ferrite is semi-conductive. The sensed voltage may be amplified and by a trans-impedance amplifier and transmitted to an A/D converter in the control unit. The sensed voltage may be correlated with a separately measured line voltages of known phases to determine the voltage phase for which the CT is measuring current. For example, during commissioning of the system the small voltage on the ferrite core may be used to correlate the measured current with the measured line voltage to determine power.

In a conventional system having a standard digital bus for distributed sampling, voltage and current measurements are not aligned. In accordance with aspects of the present disclosure, voltage and current measurements may be made synchronously. For example, by transmitting a convert start signal on the digital bus of the disclosed system, the control unit may cause synchronous sampling of current and voltage by the CTs and voltage measurement devices, respectively, to capture voltage and current measurements concurrently and deterministically.

Figure 18:
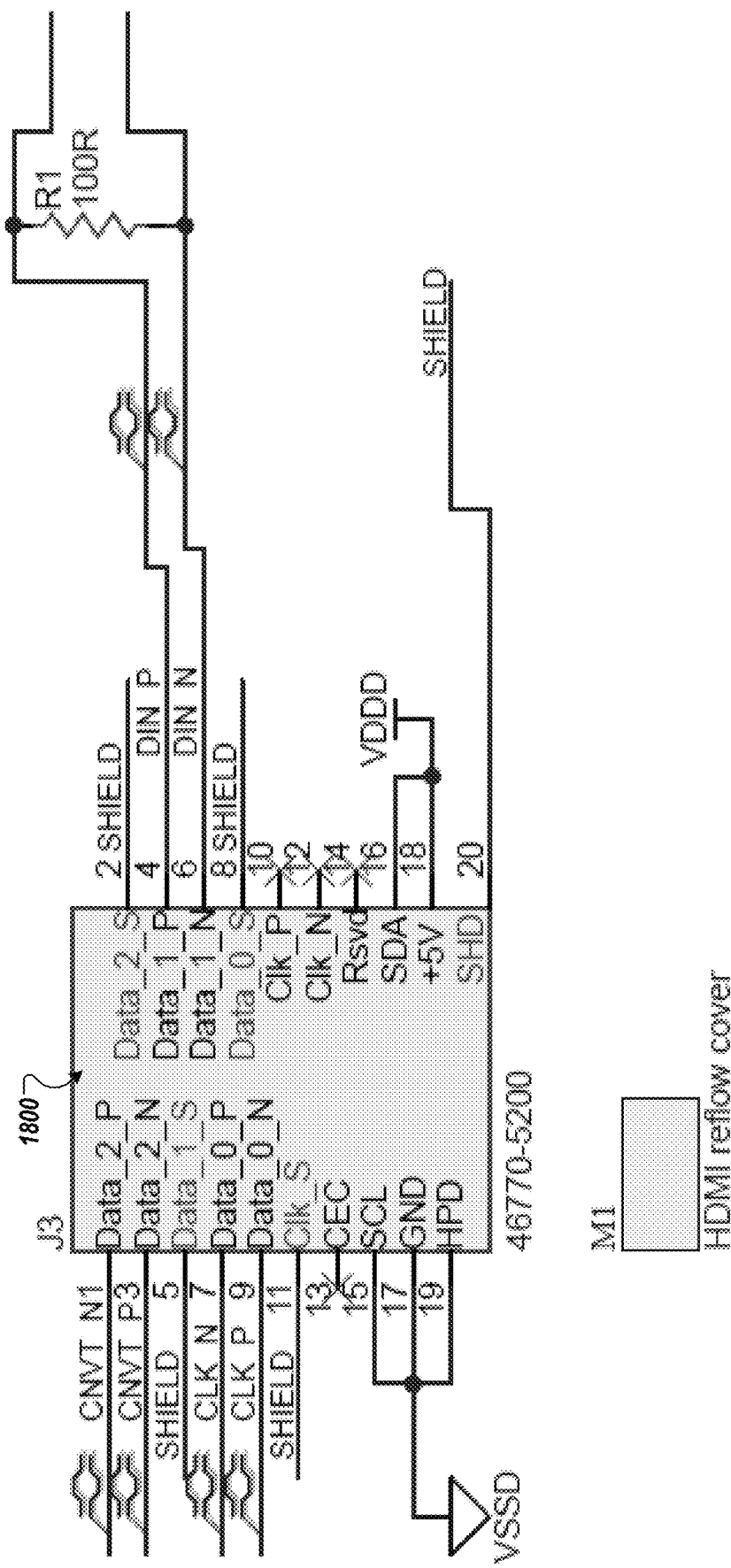
FIG. 18 illustrates electronic circuitry diagram for an example of an HDMI input 1800 for the energy monitor, in accordance with an example implementation.

FIG. 18 illustrates an electronic circuitry diagram for an example of an HDMI input 1800 for the energy monitor, in accordance with an example implementation.

Figure 19:
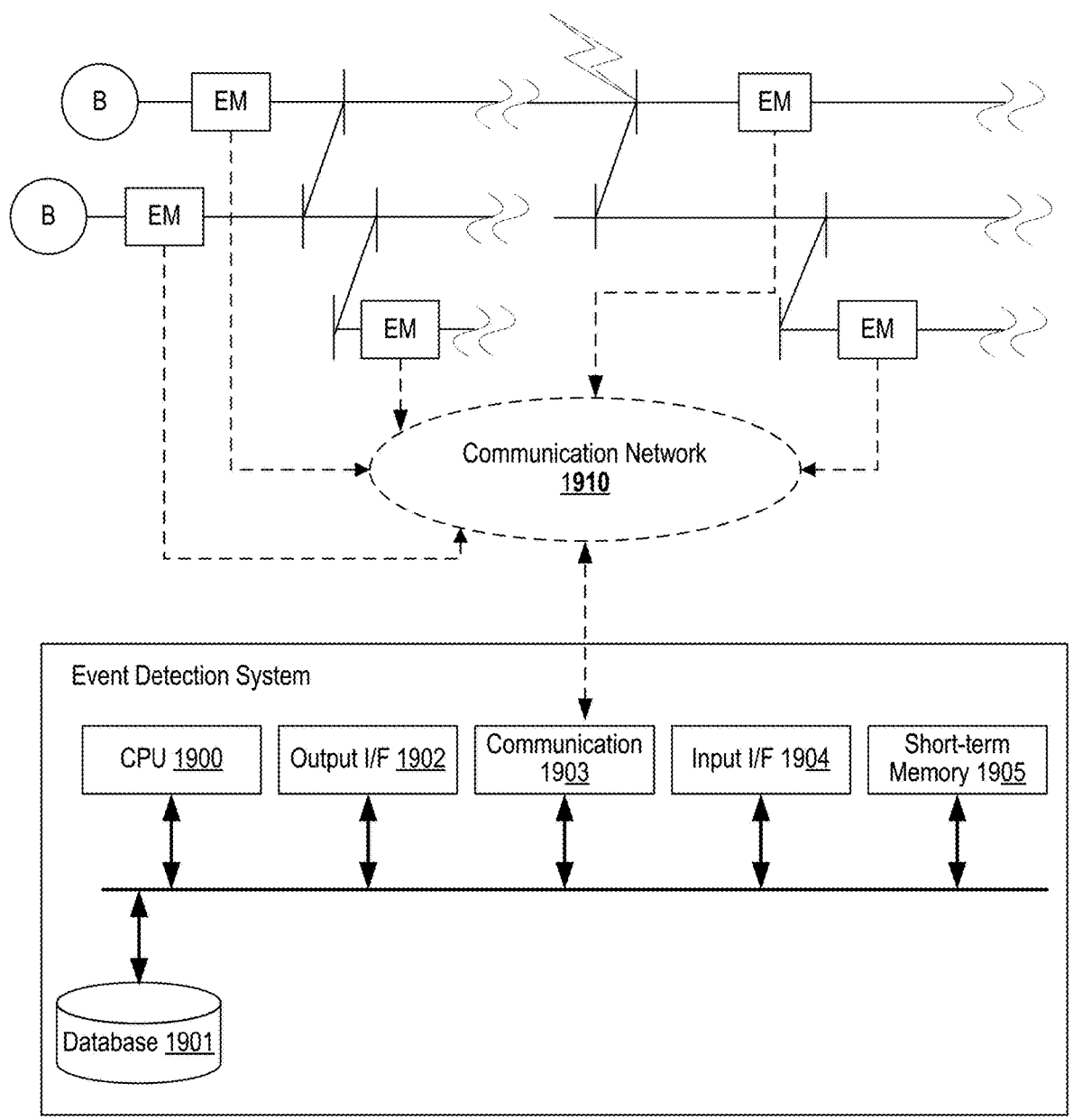
FIG. 19 illustrates an example system upon which example implementations may be applied in accordance with aspects of the present disclosure.

FIG. 19 illustrates an example system upon which example implementations may be applied in accordance with aspects of the present disclosure. As illustrated, the system can include energy monitors (Ems) applied along the power lines of a building or an area, and electrical buses (designated as B). Event detection system is an apparatus that may be in the form of any system in accordance with a desired implementation (e.g., computer, data center, etc.). For example, a computing device, such as computing device 2105 illustrated in FIG. 21 discussed above.

As illustrated in FIG. 19, signals, for example signals from CTs, may be transmitted to the event monitors (EMs) which may determine if the CT signals indicate a fault event (e.g., abnormal wear of a device connected to the monitored circuit). The EMs may transmit the monitored signals to the event detection system which may store the signal for later analysis and/or provide a fault detection indication.

The event detection system may be configured to manage a plurality of energy monitors in a power system, and can include a physical central processing unit (CPU) 1900, database 1901, output interface (I/F) 1902, communication processor 1903, input I/F 1904, and short term memory 1905 (e.g. cache). Database 1901 may be in the form of one or more storage devices configured to manage data measurements provided by energy monitors. Output I/F 1902 provides external output to the operator of the event detection system, such as waveforms, events, and so on. Communication processor 1903 can function as an interface for receiving data from the energy monitors through network 1910 and conducting initial processing. Input I/F 1904 provides interfaces for input from the operator, including keyboards, touchscreens, mouse and so on. Short term memory 1905 can function as a cache for temporary storage of data streamed from energy monitors.

Figure 20:
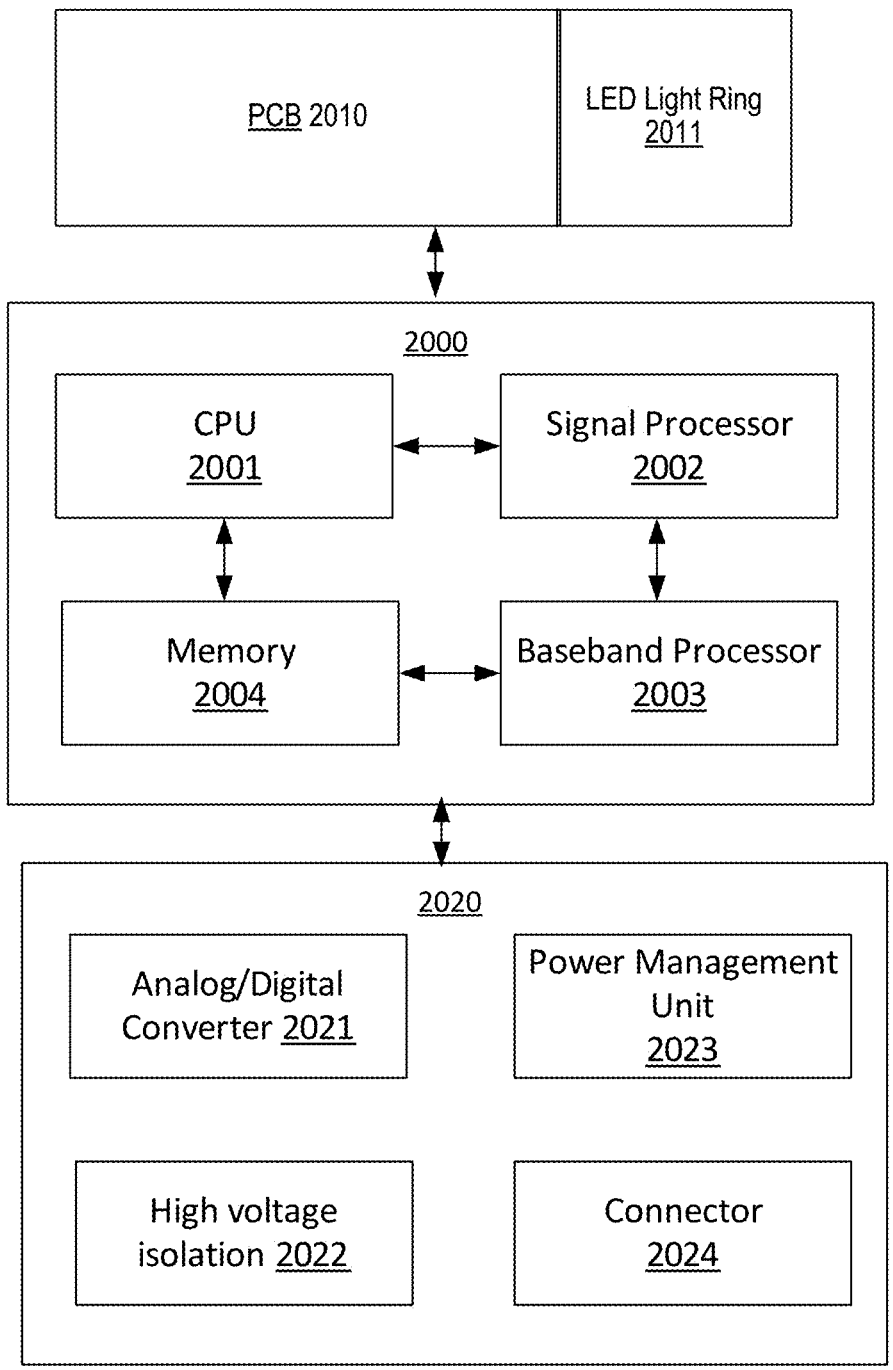
FIG. 20 illustrates an energy monitor in accordance with another example implementation.

FIG. 20 illustrates an energy monitor in accordance with another example implementation. Energy monitor may have a square shaped form factor, and can include a communications/digital layer 2000 that involves a CPU 2001, Signal Processor 2002, baseband processor 2003, and memory 2004. Data from the second level 2020 of the energy monitor is sent to signal processor 2002 in the form of digital signals, which is streamed to memory 2004 and processed by CPU 2001 to be prepared in a format for use by a receiving apparatus such as a power monitoring system. Processed data is then transmitted to the receiving apparatus by baseband processor 2003, which can be implemented as streaming data or batch data over a wireless protocol such as LTE. The data received from the signal processor 2002 can include frequency, voltage, and power data, reported at a fixed sample rate, such as 60 Hertz (Hz). In some implementations, current data may alternatively be reported and power data calculated based on the received voltage and current data. The data may be historical, streaming, or both.

The communications/digital layer 2000 is connected to a Printed circuit board (PCB) 2010 which may also involve an LED light ring 2011 configured to activate LEDs depending on different signals received and statuses obtained from the communications/digital layer 2000.

The second level 2020 can involve an analog signal system that is configured to provide digital signals to the communication/digital layer 2000 via an analog/digital converter 2021. The second level 2020 includes high voltage isolation 2022 that isolates the high voltage from the rest of the energy monitor, a power management unit 2023 that is configured to receive voltage measurements and other measurements from the power lines/power grid/power system. Connector 2024 is a connector port for a sensor array connected to the power lines/power grid/power system that may take the form of an HDMI connector port. The sensor array may include one or more CTs such as the CTs described above with respect to FIGS. 1-12.

As discussed above, the CTs may take the form of a clip that involves a PSoC 1505 (Programmable System-on-Chip) which is connected by a cable such as an HDMI cable. The clip can be configured to clip onto a bare wire from the power line/power grid/power system. The CTs can include magnetic sensors (e.g., Hall Effect sensor 1515 that are sampled (e.g. 7260 times a second), which can involve completely closed ferrous material to measure current. In an example implementation, there can be a gap in the magnetic sensor, as the permittivity of air prevents the saturation of the current, which reduces the mass of the magnetic sensor, and allows the sensor to be disposed in a smaller form factor device such as the CT 100/1000/1100/1200 depicted above in FIGS. 1-12. Example implementations of the CT may also involve a pull release tab to allow for remove and uninstall.

In example implementations, the PSoC 1505 is a microcontroller that facilitates programmatically rerouting analog submodules and handles the serial-peripheral interface communications that also reads in data from sensors built into the board. In example implementations, the sensor between the ferrite to measure flux contained within that ferrite core, which gets sampled and dumped onto the analog/digital converter. In example implementations, there is a physical tap to the ferrite core that goes into the analog-digital converter. Such an implementation can facilitate, at the time of commissioning (e.g., loading the system) to measure the capacitive coupling to the voltage line. Such implementations allows for the identification of the phase of the energy monitor without having to manually determine the voltage phase.

In such implementations, based on the capacitive coupling of the CTs when clipped, the magnetic sensor (e.g., Hall Effect sensor 1515) has enough surface area and enough capacitive coupling to allow for a phase amplification system to be applied. Further, the CTs have sufficient distance from the wire to facilitate a capacitive coupling to be coupled to the voltage signal for a brief moment, which can be amplified. Through such a signal amplifier, the energy monitor can automatically provide a signal as to what voltage phase it is operating under.

In example implementations, Communications circuits 1605 utilized in the energy monitor can utilize a Schmitt trigger to generate a clock signal from signals received through the cable between the sensor array or CTs and the energy monitor. Software in the Communications circuits 1605 can then generate a phase lock loop (PLL) that can utilized as the basis of the clock for sampling purposes. In such example implementations, the serial peripheral interface can be utilized to incorporate the input voltage frequency for the Schmitt trigger.

In example implementations, the energy monitor needs to receive data samples at the same time. Thus, based on the Schmitt trigger and the PLL, the energy monitor can synchonistically instruct all sensors (e.g., CTs) to sample. Then, for the sample, the Communications circuits 1605 can that the sample, move it into the shift register, and once all the systems have the data in the shift register, the communications circuits 1605 shifts the data out, waits, and then fires for the next sample on the next cycle.

In example implementations, there is a command mode in which specific commands can be issued to the energy monitors. The energy monitor has LEDs as an interface to indicate what circuits the energy monitor is connected to, so that the installer can visually confirm the system.

During data acquisition mode, example implementations involve a very high speed digital bus, which necessitates the sampling of all data simultaneously, especially since the incoming voltage may be far away physically. For the data to be aligned, all of the data, despite the physical disparity has to be instantaneously cycled exactly precisely on the same microsecond. And so that's where the alignment and this requirement for loading up boot sequence.

In example implementations, the energy monitor is aware of its own serial number along with its position along a chain of energy monitors. Such data is implemented on some software configurable registers that when booted, informs the energy monitor regarding all the details. Because there are ferrite sensors in mechanical motion, the positioning of the ferrite and subsequently the intensity of the flux varies with the mechanical motion. Calibration of each energy monitor in the factory, where test currents are simulated through the system and the calibration is incorporated into sensor. Thus, when the energy monitor is connected to the system, it utilizes the scaling factors across the current band. (e.g., 0.1 amp, 0.5 amp, 1 amp, 3 amps, 10 amps, 20 amps). These pre-determined scaling factors may be associated with each combination of ferrite and sensor and may be stored on the software configurable register.

Figure 21:
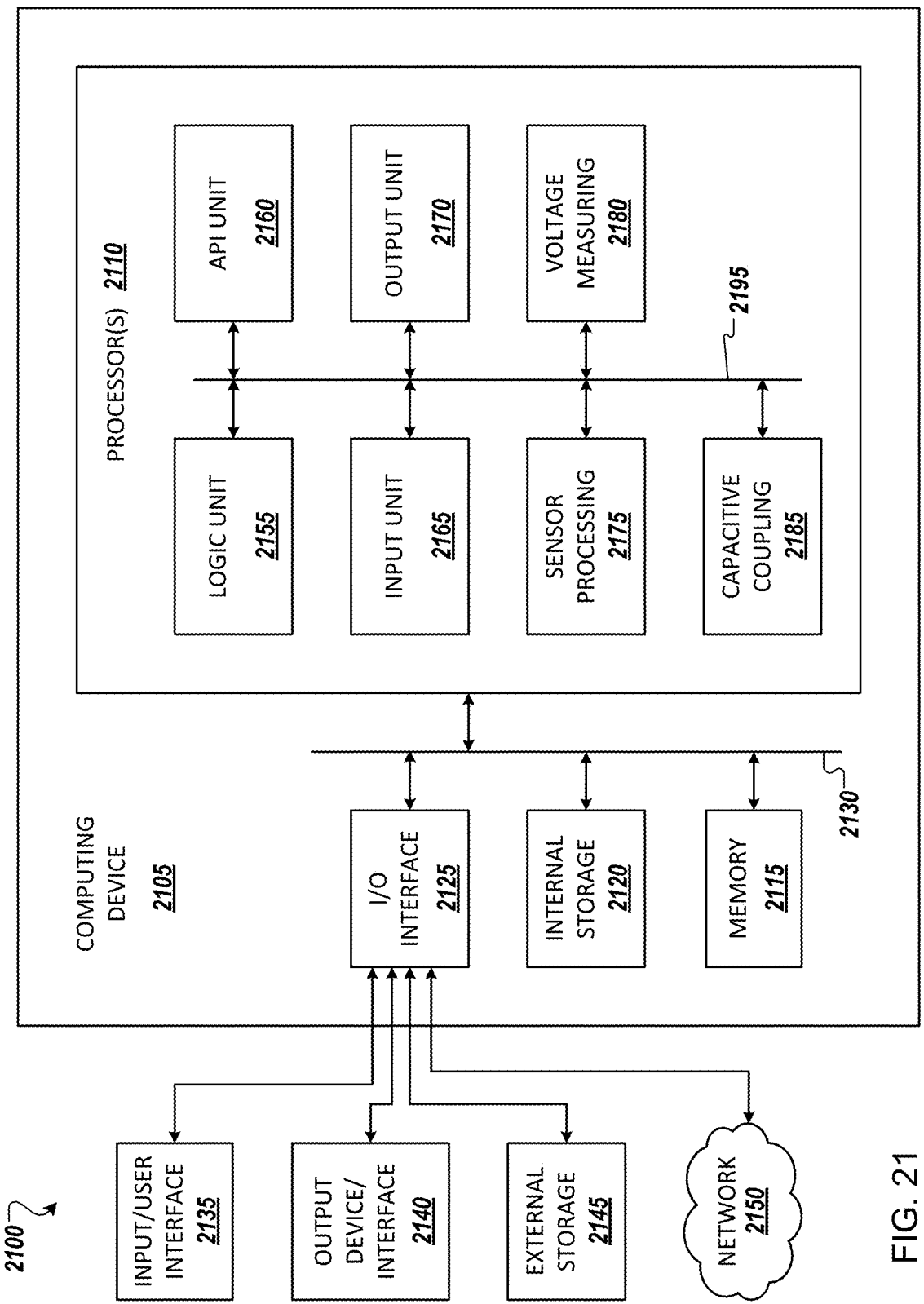
FIG. 21 illustrates an example computing environment with an example computer device suitable for use in some example implementations of the present application.

FIG. 21 illustrates an example computing environment 2100 with an example computer device 2105 suitable for use in some example implementations. Computing device 2105 in computing environment 2100 can include one or more processing units, cores, or processors 2110, memory 2115 (e.g., RAM, ROM, and/or the like), internal storage 2120 (e.g., magnetic, optical, solid state storage, and/or organic), and/or I/O interface 2125, any of which can be coupled on a communication mechanism or bus 2130 for communicating information or embedded in the computing device 2105.

Computing device 2105 can be communicatively coupled to input/interface 2135 and output device/interface 2140. Either one or both of input/interface 2135 and output device/interface 2140 can be a wired or wireless interface and can be detachable. Input/interface 2135 may include any device, component, sensor, or interface, physical or virtual, which can be used to provide input (e.g., buttons, touch-screen interface, keyboard, a pointing/cursor control, microphone, camera, braille, motion sensor, optical reader, and/or the like).

Output device/interface 2140 may include a display, television, monitor, printer, speaker, braille, or the like. In some example implementations, input/interface 2135 (e.g., user interface) and output device/interface 2140 can be embedded with, or physically coupled to, the computing device 2105. In other example implementations, other computing devices may function as, or provide the functions of, an input/interface 2135 and output device/interface 2140 for a computing device 2105. These elements may include, but are not limited to, well-known AR hardware inputs so as to permit a user to interact with an AR environment.

Examples of computing device 2105 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, server devices, other computers, information kiosks, televisions with one or more processors embedded therein and/or coupled thereto, radios, and the like).

Computing device 2105 can be communicatively coupled (e.g., via I/O interface 2125) to external storage 2145 and network 2150 for communicating with any number of networked components, devices, and systems, including one or more computing devices of the same or different configuration. Computing device 2105 or any connected computing device can be functioning as, providing services of, or referred to as a server, client, thin server, general machine, special-purpose machine, or another label.

I/O interface 2125 can include, but is not limited to, wired and/or wireless interfaces using any communication or I/O protocols or standards (e.g., Ethernet, 802.11xs, Universal System Bus, WiMAX, modem, a cellular network protocol, and the like) for communicating information to and/or from at least all the connected components, devices, and network in computing environment 2100. Network 2150 can be any network or combination of networks (e.g., the Internet, local area network, wide area network, a telephonic network, a cellular network, satellite network, and the like).

Computing device 2105 can use and/or communicate using computer-usable or computer-readable media, including transitory media and non-transitory media. Transitory media includes transmission media (e.g., metal cables, fiber optics), signals, carrier waves, and the like. Non-transitory media includes magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computing device 2105 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C#, Java, Visual Basic, Python, Perl, JavaScript, and others).

Processor(s) 2110 can execute under any operating system (OS) (not shown), in a native or virtual environment. One or more applications can be deployed that include logic unit 2155, application programming interface (API) unit 2160, input unit 2165, output unit 2170, sensor processing unit 2175, voltage measuring unit 2180 and capacitive coupling unit 2185, and inter-unit communication mechanism 2195 for the different units to communicate with each other, with the OS, and with other applications (not shown).

For example, sensor processing unit 2175, voltage measuring unit 2180 and capacitive coupling unit 2185 may implement aspects of one or more of the example implementations discussed above. The described units and elements can be varied in design, function, configuration, or implementation and are not limited to the descriptions provided.

In some example implementations, when information or an execution instruction is received by API unit 2160, it may be communicated to one or more other units (e.g., model sensor processing unit 2175, voltage measuring unit 2180 and capacitive coupling unit 2185).

In some instances, the logic unit 2155 may be configured to control the information flow among the units and direct the services provided by API unit 2160, input unit 2165, sensor processing unit 2175, voltage measuring unit 2180 and capacitive coupling unit 2185 in some example implementations described above. For example, the flow of one or more processes or implementations may be controlled by logic unit 2155 alone or in conjunction with API unit 2160.

The foregoing detailed description has set forth various embodiments of the devices and/or processes via the use of block diagrams, schematics, and examples. Insofar as such block diagrams, schematics, and examples contain one or more functions and/or operations, each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, the embodiments disclosed herein, in whole or in part, can be equivalently implemented in standard integrated circuits, as one or more programs executed by one or more processors, as one or more programs executed by one or more controllers (e.g., microcontrollers), as firmware, or as virtually any combination thereof.

While certain embodiments have been described, these embodiments have been presented by way of example only, and are not intended to limit the scope of the protection. Indeed, the novel methods and apparatuses described herein may be embodied in a variety of other forms. Furthermore, various omissions, substitutions and changes in the form of the methods and systems described herein may be made without departing from the spirit of the protection. The accompanying implementations and their equivalents are intended to cover such forms or modifications as would fall within the scope and spirit of the protection.

We claim:

1. A current transformer comprising:
   a body having an upper half and a lower half hingedly connected to the upper half;
   a pair of ferrite cores located within one of the upper half and the lower half of the body, the pair of ferrite cores defining a gap formed between each ferrite core of the pair of ferrite cores;
   a hall-effect sensor located within the gap formed between each ferrite core of the pair of ferrite cores; and
   a memory storing a software configurable register,
   wherein the register includes a pre-determined scaling factor associated with the pair of ferrite cores and the sensor, the pre-determined scaling factor being determined by pre-calibrating the current transformer using a simulated test current.

2. The current transformer of claim 1, wherein the upper half of the body and the lower half of the body define a sensing gap configured to enclose an electrified cable.

3. The current transformer of claim 2, wherein an other of the upper half and the lower half of the body also includes one or more ferrite cores.

4. The current transformer of claim 3, wherein the pair of ferrite cores located within the one of the upper half and the lower half, and the one or more ferrite cores of the upper half and lower half are positioned to at least partially surround the sensing gap.

5. The current transformer of claim 3, further comprising an electronics package configured to use the sensor to measure a voltage produced on the pair of ferrite cores located within the one of the upper half and the lower half, and the one or more ferrite cores of the upper half and lower half.

6. A current transformer comprising:
a body comprising an upper half and a lower half hingedly connected to the upper half;
a latch mechanism comprising:
an opening formed in one of the upper half and the lower half of the body;
at least one tooth disposed on an other of the upper half and the lower half of the body and configured to engage the opening to hold the upper half and the lower half together in a closed configuration;
a grip tab configured to be gripped, coupled to the tooth and configured to translate a tension force applied to the grip tab to movement of the tooth relative to the opening such that the opening is disengaged;
a pair of ferrite cores located within one of the upper half and the lower half of the body, the pair of ferrite cores defining a gap formed between each ferrite core of the pair of ferrite cores;
a hall-effect sensor located within the gap formed between each ferrite core of the pair of ferrite cores; and
a memory storing a software configurable register,
wherein the register includes a pre-determined scaling factor associated with the pair of ferrite cores and the sensor, the pre-determined scaling factor being determined by pre-calibrating the current transformer using a simulated test current.

7. The current transformer of claim 6, wherein the latch mechanism further comprises a slider mechanism mechanically coupled to the grip tab, wherein the at least one tooth is mechanically coupled to slider.

8. The current transformer of claim 7, wherein the latch mechanism further comprises a biasing member disposed adjacent to the slider mechanism and configured to provide a biasing force to urge the at least one tooth to engage the opening.

9. The current transformer of claim 7, wherein the at least one tooth extends laterally to engage the opening.

10. A power distribution system comprising:
a power source;
a power distribution line electrically coupled to the power source;
a current transformer comprising a sensing gap configured to mechanically couple to an exterior of the power distribution line, the current transformer configured to extract current from the power distribution line; and
an electronic device electrically coupled to the current transformer and configured to be powered by the current extracted from the power distribution line,
wherein the current transformer comprises:
a body having an upper half and a lower half hingedly connected to the upper half;
a pair of ferrite cores located within one of the upper half and the lower half of the body, the pair of ferrite cores defining a gap formed between each ferrite core of the pair of ferrite cores; and
a hall-effect sensor located within the gap formed between each ferrite core of the pair of ferrite cores, the sensor,
wherein the current transformer further comprises a memory storing a software configurable register, and
wherein the register includes a pre-determined scaling factor associated with the pair of ferrite cores and the sensor, the pre-determined scaling factor being determined by pre-calibrating the current transformer using a simulated test current.

11. The power distribution system of claim 10, wherein the upper half of the body and the lower half of the body define a sensing gap configured to enclose an electrified cable.

12. The power distribution system of claim 11, wherein an other of the upper half and the lower half of the body also includes one or more ferrite cores.

13. The power distribution system of claim 12, wherein the pair of ferrite cores located within the one of the upper half and the lower half, and the one or more ferrite cores of the upper half and lower half are positioned to at least partially surround the sensing gap.

\* \* \* \* \*